(12) United States Patent
Kajigaya et al.

(10) Patent No.: US 7,511,347 B2
(45) Date of Patent: Mar. 31, 2009

(54) SEMICONDUCTOR INTEGRATED CIRCUIT FOR HIGH-SPEED, HIGH-FREQUENCY SIGNAL TRANSMISSION

(75) Inventors: Kazuhiko Kajigaya, Tokyo (JP); Kanji Otsuka, Tokyo (JP)

(73) Assignee: Elpida Memory Inc., Tokyo (JP)

( * ) Notice: Subject to any disclaimer, the term of this patent is extended or adjusted under 35 U.S.C. 154(b) by 269 days.

(21) Appl. No.: 11/281,743

(22) Filed: Nov. 18, 2005

(65) Prior Publication Data

US 2006/0108640 A1    May 25, 2006

(30) Foreign Application Priority Data

Nov. 22, 2004    (JP)    ............... 2004-338237

(51) Int. Cl.
*H01L 27/092*    (2006.01)
(52) U.S. Cl. ............... 257/371; 257/E27.062
(58) Field of Classification Search ......... 257/213, 257/288, 368, 369, 371, 372, 373, E27.06, 257/E27.062, E27.063, E27.064, E27.065, 257/E27.066, E27.067
See application file for complete search history.

(56) References Cited

U.S. PATENT DOCUMENTS 5,929,469 A * 7/1999 Mimoto et al. ............... 257/208
2002/0044012 A1* 4/2002 Otsuka et al. ............... 327/586

FOREIGN PATENT DOCUMENTS

JP    2002-124635    4/2002
JP    WO 03/090374 A1 * 10/2003

* cited by examiner

*Primary Examiner*—Evan Pert
*Assistant Examiner*—Kevin Quinto
(74) *Attorney, Agent, or Firm*—McDermott Will & Emery LLP

(57) ABSTRACT

A semiconductor integrated circuit comprising: a pair of MOS transistors which are formed in a same well on a semiconductor substrate and arranged adjacent to each other with a distance such that charge exchange between capacitances of respective drain diffusion layers is possible; and a wiring structure which is formed to apply differential signals to respective gates of the pair of MOS transistors and to apply a common potential to respective sources of the pair of MOS transistors.

11 Claims, 20 Drawing Sheets

FIG.10A  STACKED PAIR LINE
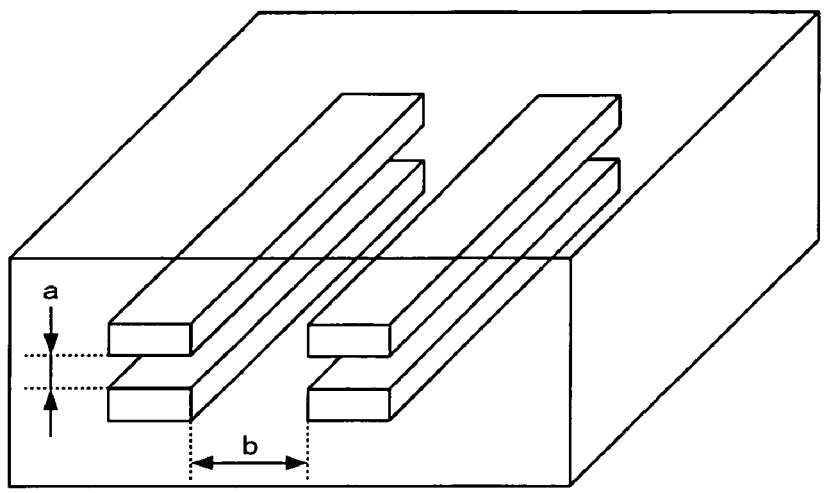
FIG.10B  PAIR COPLANAR LINE
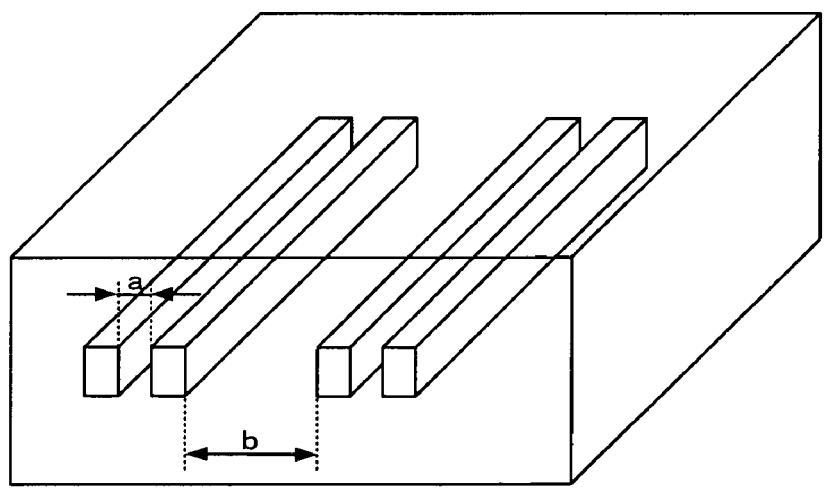

TIME

8Gbps

9Gbps

10Gbps

11Gbps

12Gbps

RISE TIME

① 152ps
② 293ps
③ 125ps
④ 243ps

FALL TIME

① 496ps
② 576ps
③ 269ps
④ 534ps

SEMICONDUCTOR INTEGRATED CIRCUIT FOR HIGH-SPEED, HIGH-FREQUENCY SIGNAL TRANSMISSION

BACKGROUND OF THE INVENTION

1. Field of the Invention

The present invention relates to a semiconductor integrated circuit, and more particularly, to a semiconductor integrated circuit configured to enable transmission of high-speed signals with frequencies of GHz in a digital circuit.

2. Related Art

In recent years, finer patterning has further proceeded in the semiconductor integrated circuit using MOS circuit. For example, the process of 0.18 µm has achieved widespread use, the process of 0.13 µm is coming into practical use, and the process of 0.09 µm has begun to be introduced. Further, with the patterning made finer in the semiconductor integrated circuit, requested is high-speed operation using high-frequency clocks, and demanded is the reliability of switching operation in a band of several GHz.

Various attempts have been made to implement faster operation in the semiconductor integrated circuit. It is advantageous in increasing the operation speed to achieve further finer patterning to increase the degree of integration, and in addition thereto, attention is directed toward new techniques on materials of wiring and gate insulator, employment of FinFET and the like. However, difficulties often arise in thus changing the materials, structure, process and the like, and it is desired to obtain higher speed in the semiconductor circuit using the existing process and elemental techniques.

Generally, in a high-frequency region, the capacitance of a MOS transistor increases and becomes a factor of preventing high-speed operation. Particularly, it is a problem that an increase in capacitance of a depletion layer of a drain diffusion layer requires time for charge transfer in the state transition associated with switching operation. Further, another restriction on high-speed operation is the existence of RC delay in wiring to transmit input and output signals of a MOS transistor and wiring between the power supply and ground in the entire semiconductor integrated circuit.

Techniques have been proposed to enable high-speed operation in the state transition in the MOS transistor without changing the process and materials. For example, according to a circuit configuration as disclosed in JP 2002-124635, a varactor device is arranged adjacent to a MOS transistor, and fast switching of the MOS transistor is achieved by the varactor effect.

Meanwhile, to transmit high-speed signals, a differential circuit is known widely where differential signals which have mutually opposite phases are input and output. Generally, a differential circuit is comprised of two series circuits including PMOS and NMOS transistors, each of MOS transistors has the same structure, and control to pass a constant current only obtains a differential component. However, ideal operation is hard to implement because the delay arises in the transition of signal level in the switching operation as described above. Further, it is difficult to overcome such a problem by the techniques as disclosed in above-mentioned JP 2002-124635.

SUMMARY OF THE INVENTION

It is an object of the present invention to provide a semiconductor integrated circuit enabling fast switching operation while avoiding much time taken in the state transition caused by an increase in a capacitance when high-speed differential signals are supplied to a MOS transistor.

An aspect of the present invention is a semiconductor integrated circuit comprising: a pair of MOS transistors which are formed in a same well on a semiconductor substrate and arranged adjacent to each other with a distance such that charge exchange between capacitances of respective drain diffusion layers is possible; and a wiring structure which is formed to apply differential signals to respective gates of said pair of MOS transistors and to apply a common potential to respective sources of said pair of MOS transistors.

According to the aspect of the invention, in driving a pair of MOS transistors (pair transistors) with high-speed signals, fast charge supply is required corresponding to the capacitance of the MOS transistors that become the problem in the high-frequency region, and charges of the transistors vary in opposite polarities because differential signals are applied to respective gates. At this time, since respective drain diffusion layers of the pair transistors are arranged adjacent to each other in the same well, charges of one of the drain diffusion layer capacitances are transferred to the other one of the drain diffusion layer capacitances in a short time when the input signal is inverted, whereby the charge exchange effect is exhibited with reliability in response to the fast state transition. Particularly, the differential structure using pair transistors enables fast switching operation. According to the constitution of the invention, it is possible to implement high-speed operation of a logic circuit comprised of MOS transistors without using specific process and material.

In the present invention, said pair of MOS transistors may be arranged adjacent to each other with a distance such that a transit time of charges by said charge exchange between said drain diffusion layers is smaller than a transition time during phase inversion of said differential signals.

The present invention may further comprise a differential circuit comprised of said pair of MOS transistors, wherein in said wiring structure, differential input signals includes a positive signal and an inverted signal, said positive signal is applied to one gate of said pair of MOS transistors, said inverted signal is applied to the other gate of said pair of MOS transistors, and differential output signala are output from said drain diffusion layer of each of said pair of MOS transistors.

In the present invention, in addition to said pair of MOS transistors, one or more other MOS transistors may be formed in the same well and may be arranged with a distance such that interference due to said charge exchange between said drain diffusion layers of said pair of MOS transistors and drain diffusion layers of said other MOS transistors does not occur.

In the present invention, said pair of MOS transistors may be arranged to satisfy a relationship $1.5 \times d \leq k$ where d is a distance between said drain diffusion layers of said pair of MOS transistors, and k is a minimum distance between said drain diffusion layers of said pair of MOS transistors and drain diffusion layers of said other MOS transistors.

In the present invention, said pair of MOS transistors may be arranged adjacent to each other so that sides of said drain diffusion layers along a gate width direction are opposed to each other.

In the present invention, a plurality of pairs of MOS transistors may be arranged in the same well, and gates, drains and sources thereof may be mutually connected respectively.

In the present invention, characteristic impedance of said paired structure of transmission line may be determined in a range of 50 to 200Ω.

In the present invention, a relationship 2a≦b may be satisfied where a is a distance between one line and the other line of said paired structure of transmission line, and b is a distance between said paired structure of transmission line and another paired structure of transmission line adjacent to said paired structure of transmission line.

In the present invention, said wiring structure may include power supply-ground pair line connected to each of sources.

An aspect of the present invention is a semiconductor integrated circuit comprising: a pair of MOS transistors which are formed in a same well on a semiconductor substrate and arranged adjacent to each other with a distance such that charge exchange between capacitances of respective drain diffusion layers is possible; and a wiring structure which is formed so that a termination resistor circuit is configured using on-resistances of respective said pair of MOS transistors on a first line and a second line which transmit differential signals, and said first line is connected to one of said drain diffusion layers of said pair of MOS transistors, while said second line is connected to the other one of said drain diffusion layers of said pair of MOS transistors.

An aspect of the present invention is a semiconductor integrated circuit comprising: a pair of diffusion layer resistances which are formed in a same well on a semiconductor substrate and arranged adjacent to each other with a distance such that charge exchange there between is possible; and a wiring structure which is formed so that a termination resistor circuit is configured using said pair of diffusion layer resistances on a first line and a second line which transmit differential signals, and said first line is connected to one of said diffusion layer resistances, while said second line is connected to the other one of said diffusion layer resistances.

As described above, according to the present invention, a pair of MOS transistors are formed in the same well so that respective drain diffusion layers of the MOS transistors are arranged adjacent to each other, and signals with mutually opposite phase are applied to respective gates, whereby in the state transition when the input signal is inverted at high speed, charges are exchanged rapidly between the drain diffusion layer capacitances to operate fast switching. Further, combining a transmission line structure with such a structure of the MOS transistors enables faster operation. Thus, according to the invention, it is possible to enable high-speed operation of a logic circuit comprised of MOS transistors without using specific process and material.

BRIEF DESCRIPTION OF THE DRAWINGS

The above and other objects and features of the invention will appear more fully hereinafter from a consideration of the following description taken in connection with the accompanying drawing wherein one example is illustrated by way of example, in which;

FIGS. 10A and 10B are views showing specific examples of a transmission line structure of the embodiment;

DETAILED DESCRIPTION OF THE INVENTION

An embodiment of the present invention will specifically be described below with reference to accompanying drawings.

Figure 1:
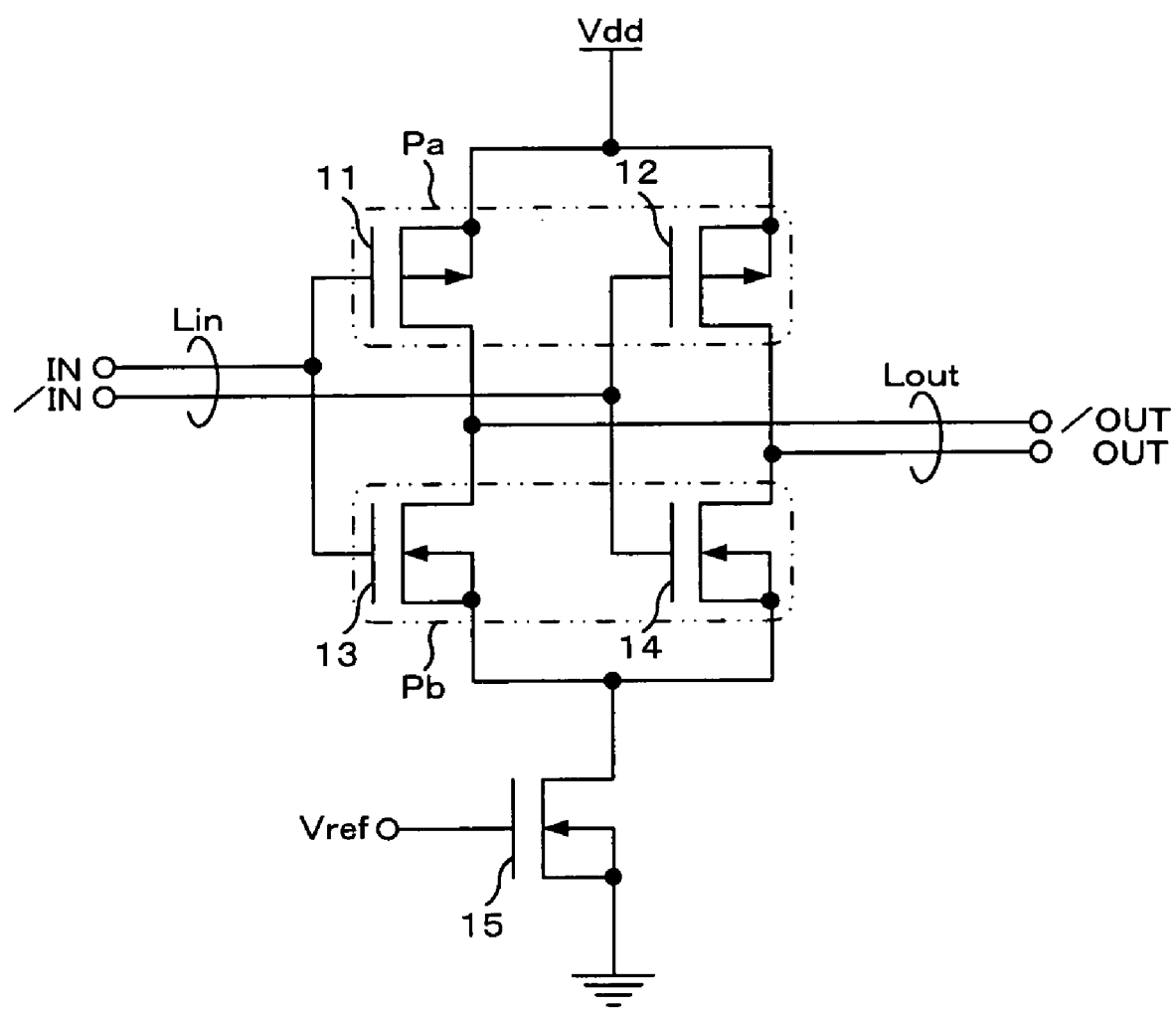
FIG. 1 is a circuit configuration diagram of a differential driver circuit as a basic structural example of the invention.

Described first is a case where the invention is applied to a differential driver circuit that is one example of the digital circuit comprised of MOS transistors. FIG. 1 is a circuit configuration diagram of the differential driver circuit as a basic structural example of the invention. The differential driver circuit as shown in FIG. 1 is comprised of PMOS transistors 11 and 12 and NMOS transistors 13, 14 and 15. Thus configured differential driver circuit receives paired high-frequency input signal IN and inverted input signal /IN via input transmission line Lin which is a paired structure of transmission line, while outputting paired output signal OUT and inverted output signal /OUT via output transmission line Lout which is a paired structure of transmission line.

In FIG. 1, an input signal IN is applied to gates of the PMOS transistor 11 and NMOS transistor 13, and an inverted output signal /OUT is output from the mutually connected drains. An inverted input signal /IN is applied to gates of the PMOS transistor 12 and NMOS transistor 14, and an output signal OUT is output from the mutually connected drains. Each source of PMOS transistors 11 and 12 is connected to the power supply Vdd, and the NMOS transistor 15 is inserted between each source of NMOS transistors 13 and 14 and the ground Vss. A constant current flows through the NMOS transistor 15 corresponding to a reference voltage Vref applied to its gate.

In this embodiment, the PMOS transistors 11 and 12 constitute complementary pair transistors Pa, and are arranged adjacent to each other on the semiconductor substrate by a structure described later. The NMOS transistors 13 and 14 constitute complementary pair transistors Pb, and are arranged adjacent to each other on the semiconductor substrate by the same structure as that in the pair transistors Pa. Constituting a differential driver circuit with such structural features enables differential operation in response to a high-speed signal, and specific effects and operation thereof will be described later.

Figure 2:
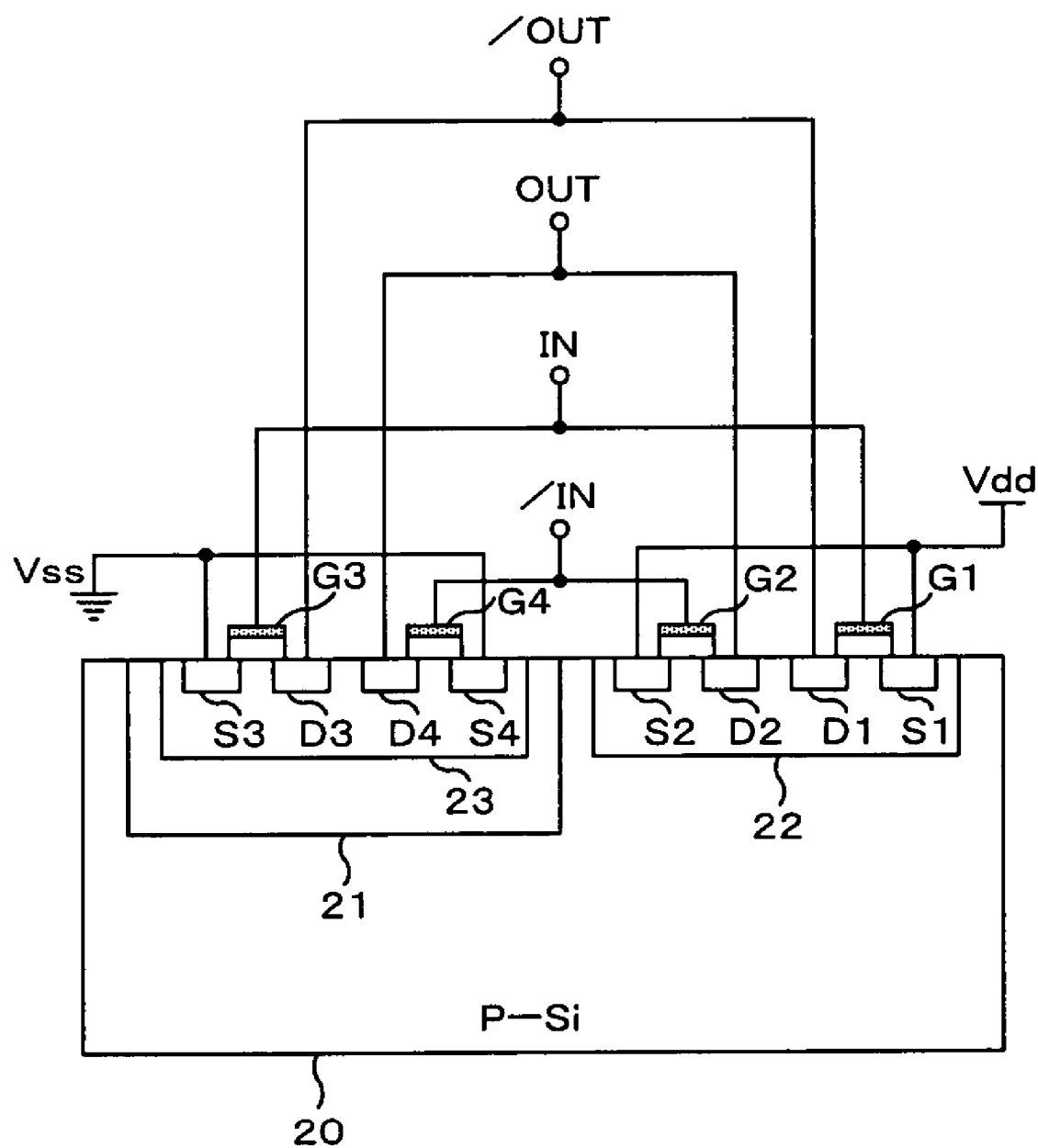
FIG. 2 is a view showing a cross-sectional structural model of a semiconductor integrated circuit corresponding to the differential driver circuit of FIG. 1.

FIG. 2 is a view showing a cross-sectional structural model of a semiconductor integrated circuit corresponding to the differential driver circuit of FIG. 1. In the cross-sectional structural model as shown in FIG. 2, N-wells 21 and 22 are formed in p-type semiconductor substrate 20 made of p-type silicon, and further, a P-well 23 is formed in the N-well 21. The N-well 22 is an N-type diffusion layer where the pair transistors Pa are arranged, and the P-well 23 is a p-type diffusion layer where the pair transistors Pb are arranged.

Diffusion layers of the source S1 and drain D1 of the PMOS transistor 11 are formed in one area of the N-well 22 where the pair transistors Pa are arranged, and an electrode of the gate G1 is provided on the diffusion layers via an oxide film. Similarly, diffusion layers of the source S2 and drain D2 of the PMOS transistor 12 are formed in the other area of the N-well 22, and an electrode of the gate G2 is provided on the diffusion layers via an oxide film. The PMOS transistors 11 and 12 have a complementary structure such that the drains D1 and D2 are arranged adjacent and opposite to each other. In this case, the distance and positional relationship between diffusion layers of two drains D1 and D2 are set at the extent of adequately causing the charge exchange effect on charges stored in each depletion layer, and the principle of the charge exchange effect will be described later.

Further, diffusion layers of the source S3 and drain D3 of the NMOS transistor 13 are formed in one area of the P-well 23 where the pair transistors Pb are arranged, and an electrode of the gate G3 is provided on the diffusion layers via an oxide film. Similarly, diffusion layers of the source S4 and drain D4 of the NMOS transistor 14 are formed in the other area of the P-well 23, and an electrode of the gate G4 is provided on the diffusion layers via an oxide film. Also in this case, as in the N-well 22, the NMOS transistors 13 and 14 have a complementary structure such that the drains D3 and D4 are arranged adjacent and opposite to each other, and are maintained at the distance and positional relationship to the extent of adequately causing the above-mentioned charge exchange effect.

In the N-well 22, two sources S1 and S2 of the pair transistors Pa are connected to the power supply Vdd. In the P-well 23, two sources S3 and S4 of the pair transistors Pb are connected to the ground Vss. Wiring is provided over the N-well 22 and P-well 23 for the input signal IN, inverted input signal /IN, output signal OUT, and inverted output signal /OUT. In other words, the input signal IN is connected to two gates G1 and G3, the inverted input signal /IN is connected to two gates G2 and G4, the output signal OUT is connected to two drains D2 and D4, and the inverted output signal /OUT is connected to two drains D1 and D3. By such a connection relationship, the entire semiconductor integrated circuit has a wiring structure corresponding to the circuit configuration as shown in FIG. 1.

In addition, the N-well 21 may be omitted to configure. Further, it is possible to substitute an N-type semiconductor substrate for the P-type semiconductor substrate 20. In this case, a P-well is also substituted for the N-well 21 and configured to surround the N-well 22. Further, as in the foregoing, the P-well surrounding the N-well 22 may be omitted.

Figure 3:
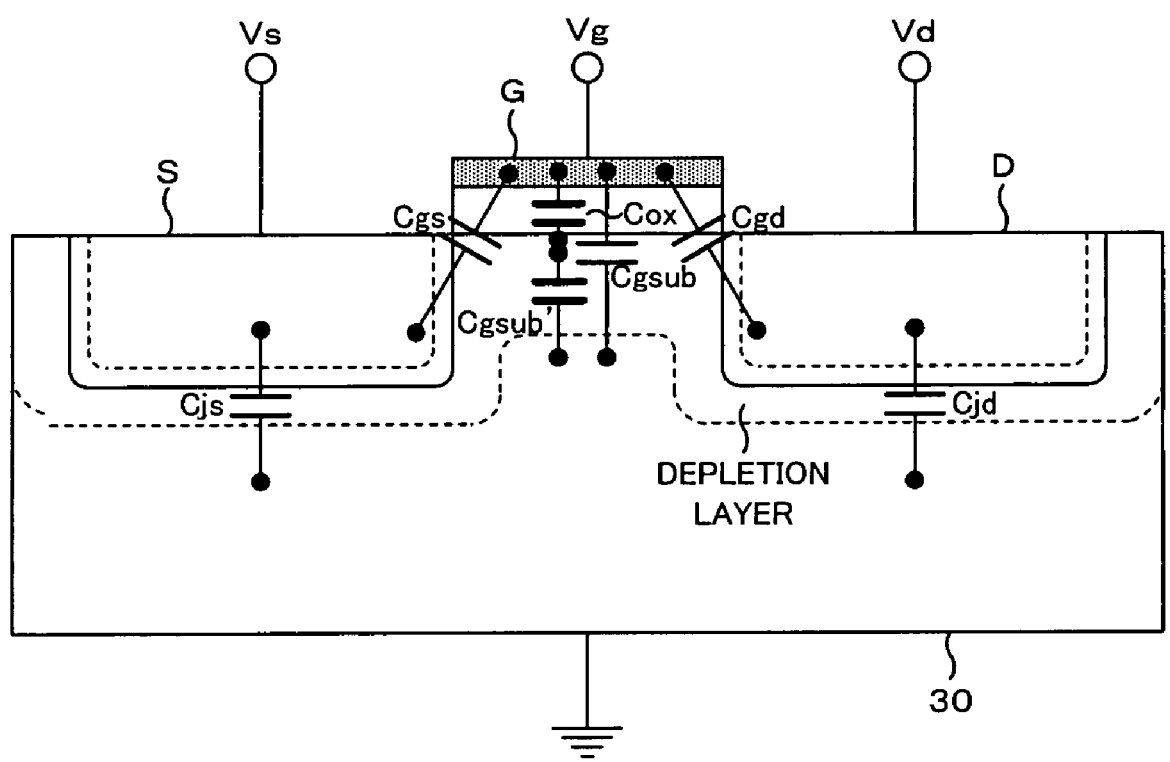
FIG. 3 is a cross-sectional structural view of a general NMOS transistor.
Figure 4:
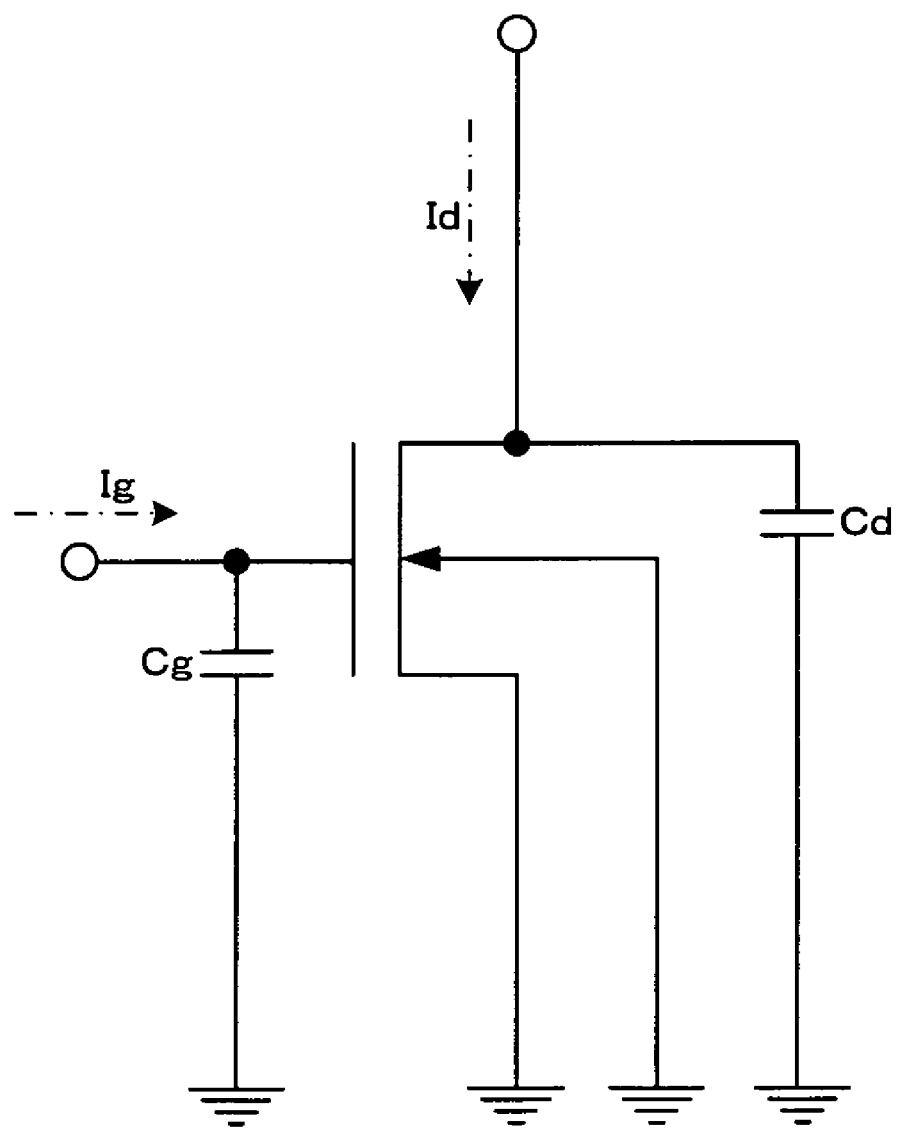
FIG. 4 is a basic circuit diagram of the NMOS transistor of FIG. 3.
Figure 5:
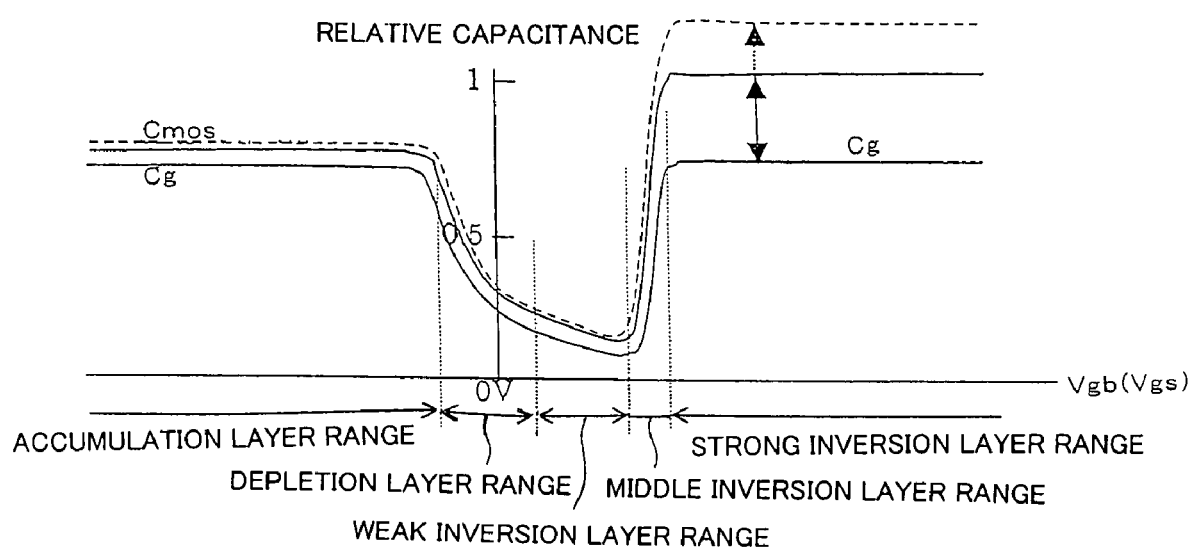
FIG. 5 is a chart illustrating the relationship between a relative capacitance to the entire capacitance Cmos and a gate voltage Vg.

Referring to FIGS. 3 to 5, the basic principle will be described below on the pair transistors having the complementary structure of this embodiment. In this embodiment, a principal purpose is to increase the operation speed of transistor. Generally, the MOS transistor formed in a semiconductor integrated circuit has various structural factors to prevent high-speed operation. Particularly, it is the problem that since various capacitances exist in the MOS transistor, it takes time to release stored charges or supply charges in the state transition associated with the switching operation, thereby restricting high-speed operation. A basic structure and behavior of a general MOS transistor will be described below as a premise of the basic principle in this embodiment.

FIG. 3 is a cross-sectional structural view of a general NMOS transistor, and FIG. 4 is a basic circuit diagram of the NMOS transistor of FIG. 3. In the NMOS transistor as shown in FIG. 3, respective diffusion layers of a drain D and a source S are formed in a semiconductor substrate 30 made of p-type silicon, and a gate G is provided in the central upper portion via an insulating film. It is assumed that voltages Vg, Vd and Vs are respectively applied to the gate G, drain D and source S, and that the semiconductor substrate 30 is maintained at sub potential Vsub. As shown in FIG. 3, it is further assumed that capacitance Cgs is generated between the gate G and source S, capacitance Cgd is generated between the gate G and drain D, and that capacitance Cgsub is generated between the gate G and p-type semiconductor substrate 30.

Herein, with a state of Vs=Vd=Vg set as a reference, when the positive voltage Vg is applied to the gate G, an area of the semiconductor substrate 30 immediately below the insulating film of the gate G is inverted to form an inversion layer, and a depletion layer is formed under the inversion layer. At this time, charges (electrons) of the electrode of the gate G and of the inversion layer are opposed to each other via the insulating film to generate capacitance Cox. Meanwhile, charges of the inversion layer and of the semiconductor substrate 30 are opposed to each other via the depletion layer to generate capacitance Cgsub'. Further, drain-depletion layer capacitance Cjd is generated between the drain D and semiconductor substrate 30, while source-depletion layer capacitance Cjs is generated between the source S and semiconductor substrate 30, each via the depletion layer.

A state is considered that pinch-off of a channel between the source S and drain D is eliminated and the channel is completed. In such a state, the voltage Vd of the drain D decreases and approaches the sub potential Vsub, the depletion layer on the drain D side narrows, and the capacitance Cjd increases. At this time, corresponding to the state of the NMOS transistor, the gate capacitance Cg and drain diffusion capacitance Cd vary. The capacitances determine capacitances Cg and Cd added to an input side and output side in the circuit configuration of FIG. 4, respectively. The entire capacitance of the NMOS transistor is expressed by Cmos (Cg+Cd).

FIG. 5 is a chart illustrating the relationship between a relative capacitance to the entire capacitance Cmos and a gate voltage Vg. In FIG. 5, the gate voltage (voltage Vgb between the gate and substrate, or voltage Vgs between the gate and source) is plotted on the horizontal axis, and the relative capacitance to the entire capacitance Cmos is plotted on the vertical axis. Further, a variation in gate capacitance Cg to the entire capacitance Cmos is also shown. With respect to the gate voltage on the horizontal axis, the area is divided into an accumulation layer range, a depletion layer range, a weak inversion layer range, a middle inversion layer range and a strong inversion layer range in ascending order of the gate voltage, corresponding to the operation state of the NMOS transistor. As shown in FIG. 5, a minimum point of the relative capacitance is obtained when the gate capacitance Cg is the minimum. The drain diffusion capacitance Cd is small in the accumulation layer range, but its contribution to the relative capacitance is slightly larger in the strong inversion layer range where the inversion layer is completed.

In FIG. 5, the dotted line shows a variation in the relative capacitance when the effect of the drain diffusion capacitance Cd is dominant. In this case, the MOS transistor is regarded as a varactor device such that the capacitance varies with the voltage (varactor effect). The above-mentioned capacitance Cox that is a main element among the entire capacitance Cmos and the drain-depletion layer capacitance Cjd are expressed by following equations:

$$Cox = \frac{\varepsilon \kappa_{ox} S}{t_{ox}} \quad (1)$$

$$Cjd = \sqrt{\frac{q \kappa_{si} \varepsilon_0 NaNd}{2(Na + Nd)(\phi - V)}} \quad (2)$$

where
kox: dielectric constant of the gate insulator
ksi: dielectric constant of silicon
S: area of the channel
tox: thickness of the gate insulator
Na: concentration of acceptor
Nd: concentration of donor
Φ: diffusion voltage In FIG. 5, when the minimum value of the entire capacitance Cmos is assumed Cmin and Cmin is a reference, it is required to inject a predetermined amount of charges Qtran to invert charges via the gate G. The charge amount Qtran is obtained from Qtran=2Vswing(Cmos) on the signal voltage Vswing at the gate voltage. In addition, the coefficient of "2" corresponds to energy to operate the transistor, and is independent of output charges of the MOS transistor.

For example, when signal voltage Vswing=0.5V and the entire capacitance Cmos=5 fF, Qtran is 5 fc (Qtran=5 fc). When the transition time (rise or fall time) of a signal applied to the gate G is 25 ps, it is necessary to pass extra instantaneous current itran of 0.2 mA (itran=0.2 mA) at the time of driving the MOS transistor. Generally, states of the power supply and ground are not ideal in the MOS transistor, and a decrease in the power supply voltage and/or an increase in the ground level may occur due to the effect of parasitic inductance. Such a voltage variation v is expressed by v=(ditran/dt)L where L is inductance. On the above-mentioned conditions, for example, when inductance L=1 nH, the voltage variation v is 8 mV (v=8 mV), and there is a possibility of interfering with supply of the instantaneous current. In order to overcome this point, it is effective to adopt the constitution of this embodiment.

In addition, FIGS. 3 to 5 illustrate the NMOS transistor, and the PMOS transistor exhibits the same behavior except the polarity of the voltage characteristic applied to the gate G which is inverted, thereby omitting descriptions thereof.

Figure 6A:
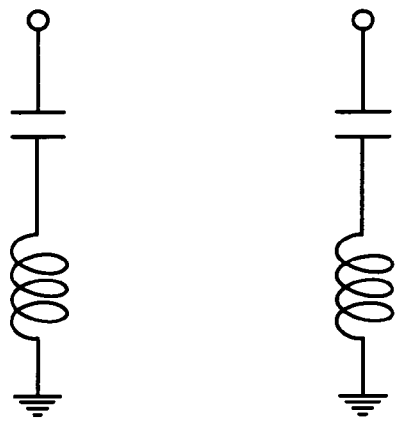
FIGS. 6A and 6B are views to schematically explain an operation of the charge exchange effect in pair transistors with the drains arranged adjacent to each other in the same well.

It is possible to implement the fast state transition by constituting the differential driver circuit as shown in FIG. 1 in which MOS transistors exhibiting the above-mentioned behavior are paired and provided with the complementary structure. Herein, the operation of the charge exchange effect is schematically described on the pair transistors such that drains are arranged adjacent to each other in the same well with reference to FIGS. 6A and 6B. FIG. 6A is a view schematically illustrating a structure of the drain-depletion layer capacitance of a conventional MOS transistor without the complementary structure of this embodiment as comparison, and a terminal of the MOS transistor is modeled by capacitance. In this case, since drains of two MOS transistors are spaced a sufficient distance apart, the structure is represented by a series circuit of each capacitance and parasitic inductance of wiring of the power supply and ground. Accordingly, in supplying charges when a high-speed signal is input, the instantaneous current is limited by the parasitic inductance and high-speed operation becomes difficult.

Figure 6B:
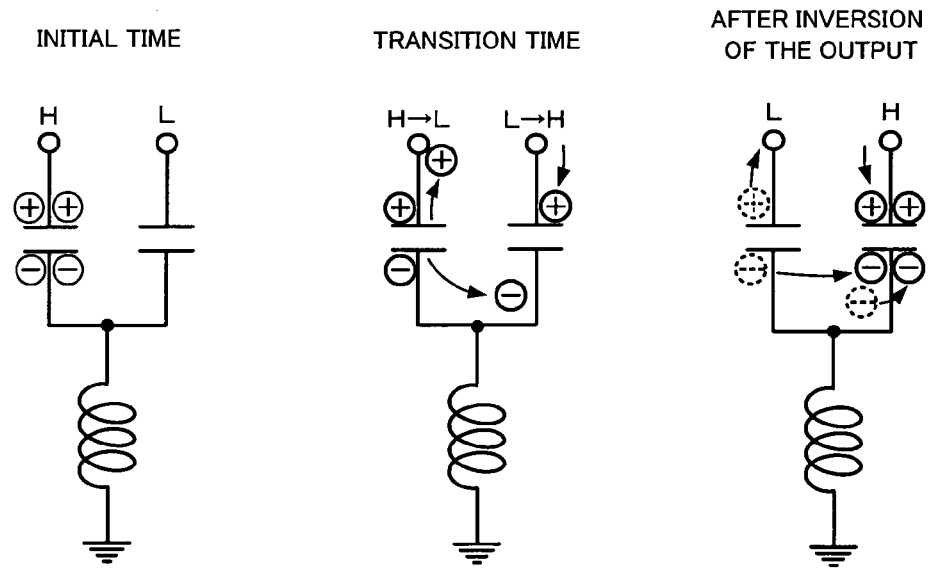

In contrast thereto, FIG. 6B schematically illustrates the complementary structure of the pair transistors of this embodiment, while showing three respective states at the initial time, at the transition time and after inversion of the output. In this case, the structure is represented by a model in which two drain-depletion layer capacitances of the pair transistors are connected in parallel and further connected in series to the common parasitic inductance. Based on the differential structure, when the drain terminal of one transistor is in high level, the drain terminal of the other transistor is in low level with an opposite phase. Charges stored in the drain-depletion layer capacitance on the high level side at the initial time are forcibly discharged to the well at the transition time during which the polarity is inverted to the low level. The drain terminal of the other transistor is in a state such that the polarity transitions from the low level to the high level, and therefore, receives the charges discharged to the well from the drain-depletion layer capacitance of one transistor. Then, after the output is inverted, polarity inversion between the low level and high level is completed, and a state is obtained in which charges are transferred to the drain-depletion layer capacitance of the transistor on the opposite side to that at the initial time. By such an operation, charges are exchanged repeatedly between two transistors in synchronization with inversion of the polarity of the signal based on the differential structure.

At this time, transfer of charges between drain-depletion layer capacitances of two transistors is carried out in the same well on the nearer side without passing through the common parasitic inductance on the farther side, when the drains are arranged adjacent to each other. Accordingly, the instantaneous current flows without causing a voltage drop of the parasitic inductance, thereby enabling high-speed operation. In this case, as the distance of charge transfer is shorter by drains coming closer to each other in the same well, the charge exchange effect acts effectively.

For example, transit time t associated with the charge exchange effect when carriers are holes will be obtained. Mobility m of the hole is $4\times10^2$ (cm$^2$/Vs) when the carrier concentration is $10^{14}\sim10^{15}$ (cm$^{-3}$). Meanwhile, when Vdd=1.8V, the drift diffusion rate Ds is $7.2\times10^2$ (cm$^2$/s). Assuming the maximum dimension of carrier transfer in the same well as X, since X=(Ds·t)$^{1/2}$ holds, transit time t is X$^2$/D. Accordingly, when the maximum dimension X=1 μm (0.0001 cm), the equation of 0.0001 cm=(7.2×10$^2$·t)$^{1/2}$ holds, and t is obtained as t=0.14×10$^{-10}$ (s)=0.014 (ns). In addition, when carriers are electrons that move faster, t is the order of 1.4 (ps). In both cases, conversion into the frequency results in the order of GHz, and by decreasing the transfer distance in the well, it is possible to obtain a significant effect on increases in the speed.

In the example of the differential driver circuit as shown in FIG. 1, the above-mentioned charge exchange effect acts on two sets of pair transistors Pa and Pb. In other words, it is a condition that MOS transistors are paired and have the above-mentioned complementary structure in which mutually opposite phase signals are input by the differential structure and high speed operation is required. Further, as shown in FIG. 2, such a dimension structure is provided that charge transfer distances on pair transistors Pa and Pb are relatively small respectively in the N-well 22 and P-well 23 in the entire P-type semiconductor substrate 20, and the charge exchange effect is thus exhibited adequately.

Figure 7:
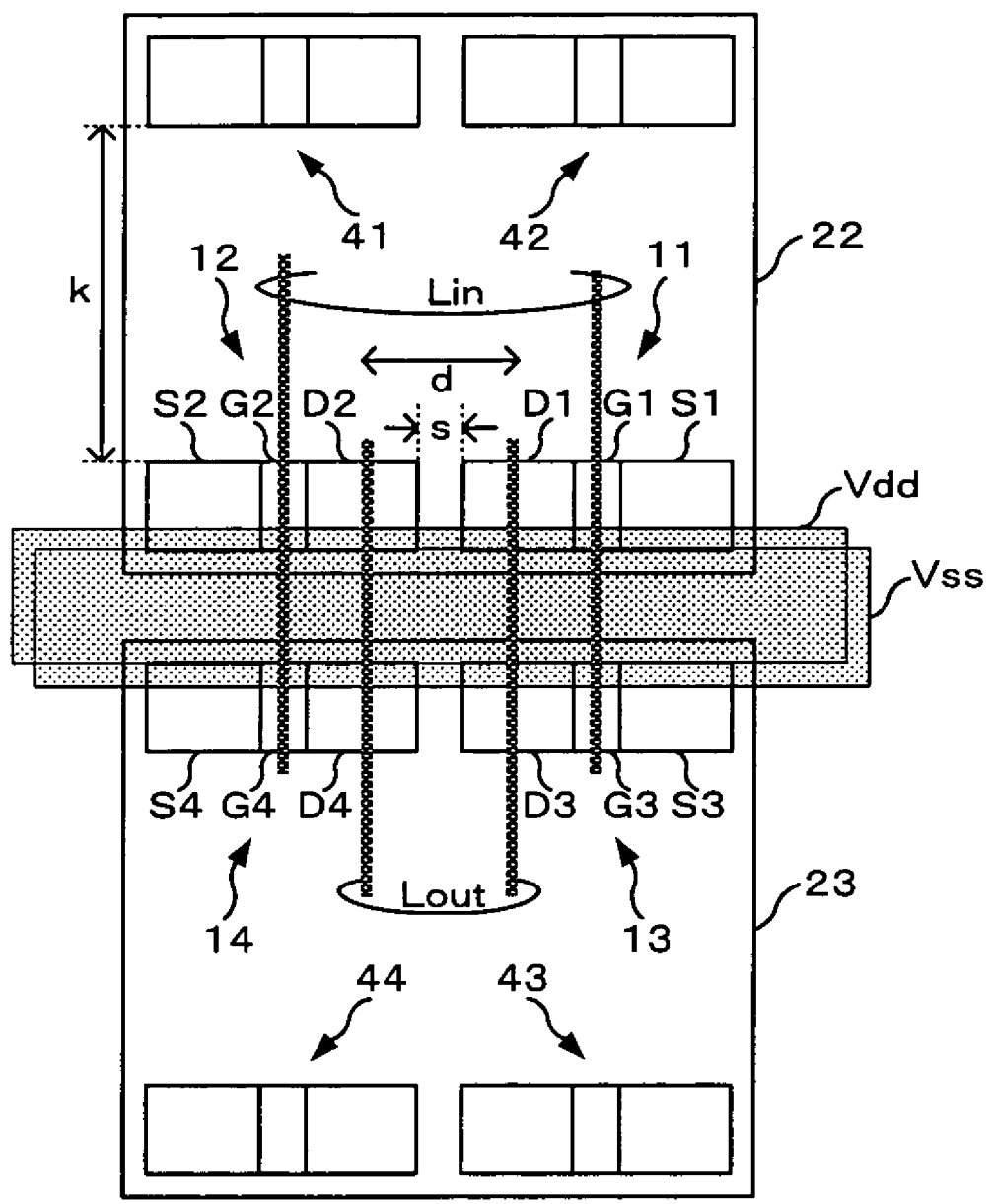
FIG. 7 shows a specific example of a planar layout corresponding to pair transistors with a complementary structure of the embodiment, where four MOS transistors are arranged in each of N-well 22 and P-well 23.
Figure 8:
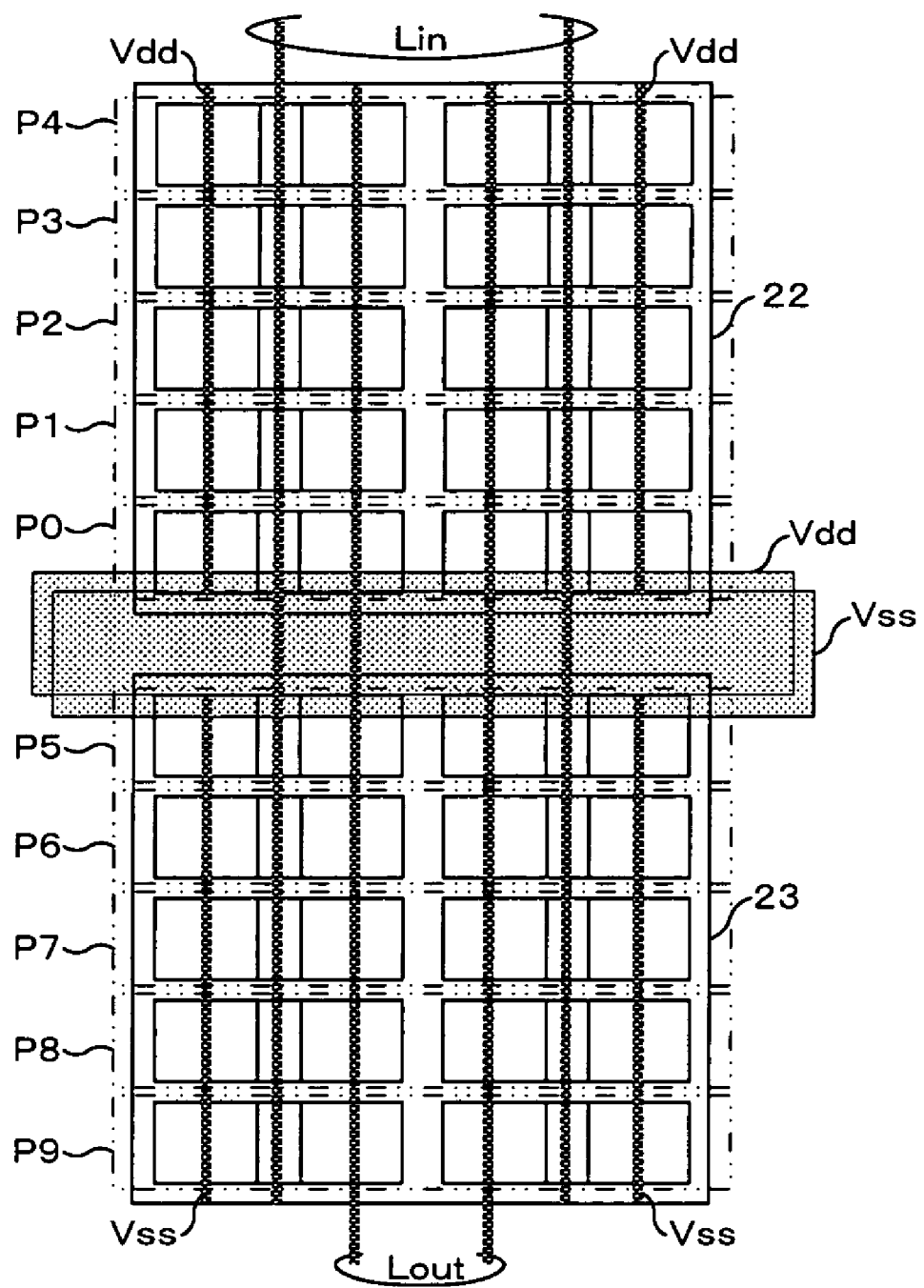
FIG. 8 shows another specific example of the planar layout corresponding to pair transistors with the complementary structure of the embodiment, where ten MOS transistors are arranged in each of N-well 22 and P-well 23.
Figure 9:
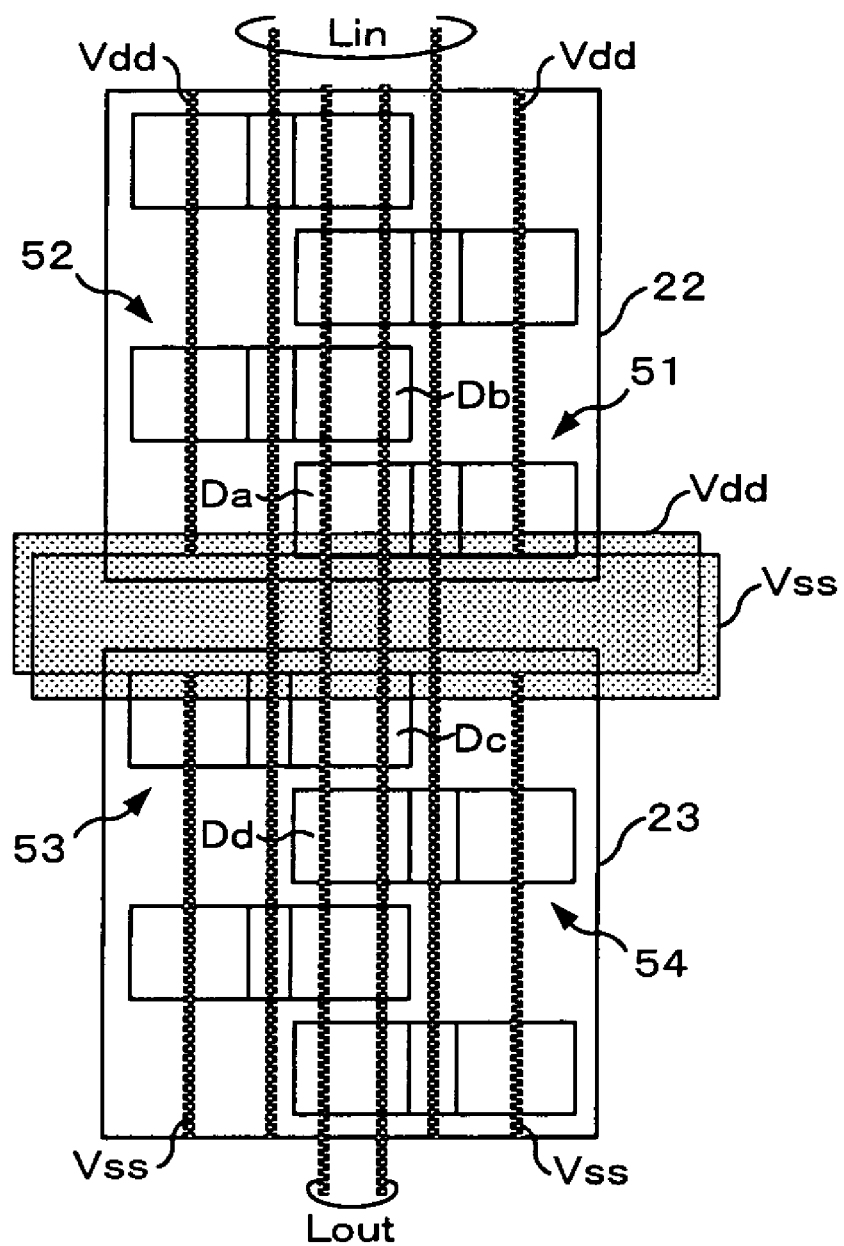
FIG. 9 shows still another specific example of the planar layout corresponding to pair transistors with the complementary structure of the embodiment, where MOS transistors are arranged in a staggered arrangement in each of N-well 22 and P-well 23.

FIGS. 7 to 9 show specific examples of the planar layout corresponding to the pair transistors with the complementary structure of this embodiment. FIG. 7 shows an example in which four MOS transistors are arranged in each of the N-well 22 and P-well 23. PMOS transistors 11 and 12 constituting the pair transistors Pa are arranged in the N-well 22, and other two PMOS transistors 41 and 42 are arranged therein. The PMOS transistors 11 and 12 with the complementary structure are in the positional relationship such that sides of drains D1 and D2 are arranged oppositely with a gap G there between. Further, a line of the other PMOS transistors 41 and 42 is arranged with a distance k apart from a line of the PMOS transistors 11 and 12. Similarly, in the P-well 23 formed in the N-well 21 (not shown) are arranged NMOS transistors 13 and 14 constituting the pair transistors Pb and other NMOS transistors 43 and 44. This arrangement is a symmetric arrangement with respect to the case of the N-well 22.

In FIG. 7, drains of the PMOS transistors 11 and 12 and drains of the NMOS transistors 13 and 14 are arranged so that sides along the gate width direction are opposed. In this case, respective sides of drain diffusion layers need to be opposed with at least a gap s satisfying the design conditions of process. Further, respective centers of the drains are arranged with a small distance d (effective charge exchange distance) to the extent of obtaining sufficient charge exchange effect in the pair transistors. In addition, the distance d may be defined as a distance between centers of drain diffusion layers, for example.

Meanwhile, it is desired to prevent adjacent interference between MOS transistors 11 to 14 and the other MOS transistors 41 to 44, and it is necessary to set the distance k sufficiently larger than the distance d not to generate unnecessary charge exchange effect. In addition, dimension conditions to specify in the planar layout will be described later.

With respect to the pair transistors Pa in the N-well 22 and the pair transistors Pb in the P-well 23 in FIG. 7, the wiring on the gate side is connected by the input transmission line Lin, and the wiring on the drain side is connected by the output transmission line Lout. Sources S1 and S2 respectively of the PMOS transistors 11 and 12 are both connected to the power supply Vdd, and sources S3 and S4 respectively of the NMOS transistors 13 and 14 are both connected to the ground Vss, thereby constituting a power supply-ground pair line as described later. By constituting the transmission line structure in the input/output wiring of each of the pair transistors Pa and Pb and wiring of the power supply and ground, measures are taken against the delay caused by the wiring, specifically described later.

FIG. 8 shows an example in which ten MOS transistors (five pair transistors) are arranged in each of the N-well 22 and P-well 23. In the N-well 22, ten PMOS transistors constituting pair transistors P0 to P4 are arranged. According to the similar arrangement, in the P-well 23, ten NMOS transistors constituting pair transistors P5 to P9 are arranged. The arrangement of FIG. 8 is capable of increasing an effective gate width by connecting two five-MOS transistors in parallel, and thus effective in increasing the drivability of the circuit.

FIG. 9 shows an example in which MOS transistors are arranged in a staggered arrangement in the N-well 22 and P-well 23. For example, PMOS transistors 51 and 52 in the N-well 22 constitute pair transistors, and similarly, NMOS transistors 53 and 54 in the P-well 23 constitute pair transistors. As shown in FIG. 9, a drain Da of the PMOS transistor 51 is arranged adjacent to a drain Db of the PMOS transistor 52, and a drain Dc of the NMOS transistor 53 is arranged adjacent to a drain Dd of the NMOS transistor 54. The above-mentioned cases of FIGS. 7 and 8 are in such a positional relationship that drains of the pair transistors are opposed and the sides thereof are along the gate width direction, and in contrast thereto, the case of FIG. 9 is in such a positional relationship that drains of the pair transistors are opposed and the sides thereof are along the gate length direction.

In this embodiment, it is possible to adopt various planar layouts as described above, and in arranging pair transistors with the complementary structure, conditions as described below are specified. First, to obtain sufficient charge exchange effect between opposite drains of pair transistors, the relationship of $1.5\times d \leq k$ is determined on the distances d and k as shown in FIG. 7. Meanwhile, when the above-mentioned distance d is 4 μm, in the case of adapting to the calculation of the above-mentioned transit time t, arrival time of carrier (hole) is 0.56 ns, but is insufficient on high speed operation.

Herein, determining the maximum effective charge exchange distance dmax as a maximum value of the distance d specifies a condition of the following equation:

$$dmax \leq tr\mu E = 0.35\ \mu E/f$$

where

μ (cm$^2$/sV): mobility of the hole in the well;

E (V/cm): electric field strength of the effective charge exchange opposite face;

tr(s): rising time of a required operation pulse; and f(Hz): required clock frequency.

For example, when $\mu=4\times10^4$ (cm$^2$/sV), $E=4.5\times10^3$ (V/cm) and f=3 (GHz), the calculation results in dmax=2.1 μm, and it is thus necessary to set the distance at a significantly short value.

Further, in arranging drains of two NMOS transistors of the pair transistors adjacent to each other, it is necessary to set the gap s between the drains not to mutually cause punch through. Generally, by setting the gap s at about two times the gate length or slightly larger, it is possible to prevent the punch through of drains. For example, in adopting the process of 0.18 μm, pair transistors may be arranged oppositely with the gap of 0.36 μm there between.

The transmission line structure of the input and output wiring will be described below which is indispensable to achieve high-speed operation in applying the complementary structure of this embodiment. In the wiring in the semiconductor circuit, the delay arises in signal transmission due to effects of the series resistance component (inductance component) and parallel capacitance, and becomes a cause of dull waveform. In this embodiment, with respect to a signal of the order of 10 GHz assumed as the operation frequency, the transition time is about 25 ps, and an allowance of jitter is about 1 to 3 ps. The RC time constant of wiring in this case needs to be limited to below about several picoseconds. For example, when the total is about 100Ω of the resistance components of the wiring and on-resistances of the transistors, the capacitance need to be limited to below several tens of picofarads, and are difficult to implement as a semiconductor circuit.

In this embodiment, by using the wiring structure that pairs two lines transmitting mutually opposite phase signals, the RC time constant is decreased as possible to guarantee characteristics of the extent to which the delay can be neglected. For example, in the differential driver circuit as shown in FIG. 1, the input transmission line Lin and output transmission line Lout are formed while clarifying the pair relationship of mutually opposite phase signals, and it is aimed at improving the characteristic of high-speed operation by adopting such a wiring structure in the entire semiconductor circuit. It is desirable that the output impedance of each transmission line is determined in a range of 50 to 200Ω. For example, the characteristic impedance may be set at 100Ω to design all the transmission lines. In this case, input and output circuits of the entire circuit are matched to the characteristic impedance as well as the transmission line, and it is further necessary to match at a termination position with a termination resistor not to cause reflection.

The transmission line structure in this embodiment will be described below based on specific examples in FIGS. 10A and 10B. FIG. 10A shows a transmission line structure using stacked pair line. The stacked pair line is a paired structure of transmission line composed of two lines arranged in parallel with a distance a apart from one another, and another paired structure of transmission line is arranged in parallel and adjacent to one paired structure of transmission line with a distance b away from one paired structure of transmission line, where the direction of the distance a is perpendicular to the direction of the distance b. In this case, it is a condition that the relationship between the distances a and b satisfies 2a≦b.

FIG. 10B shows a transmission line structure using pair coplanar line. The pair coplanar line is a paired structure of transmission composed of two lines arranged in parallel with a distance a apart from one another, and another paired structure of transmission line is arranged in parallel and adjacent to one paired structure of transmission line with a distance b away from one paired structure of transmission line, where the direction of the distance a is parallel to the direction of the distance b. In this case, it is a condition that the relationship between the distances a and b satisfies 2a≦b.

In this embodiment, in addition to application of the above-mentioned transmission line structure to the input and output wiring, it is desirable to apply the above-mentioned transmission line structure to power supply-ground pair line composed of wiring for the power supply and wiring for the ground. In the power supply-ground pair line applying the transmission line structure, parasitic inductance of the power supply line can be neglected which becomes a problem in the high-frequency region, and it is possible to supply charges at high speed to the pair transistors of this embodiment. In addition, in the examples of the planar layout as shown in FIGS. 7 to 9, each wiring is formed of the power supply Vdd and ground Vss while assuming the application of the power supply-ground pair line. In this case, the characteristic impedance of the power supply-ground pair line is desirably made smaller than that of the input and output transmission line.

Figure 11:
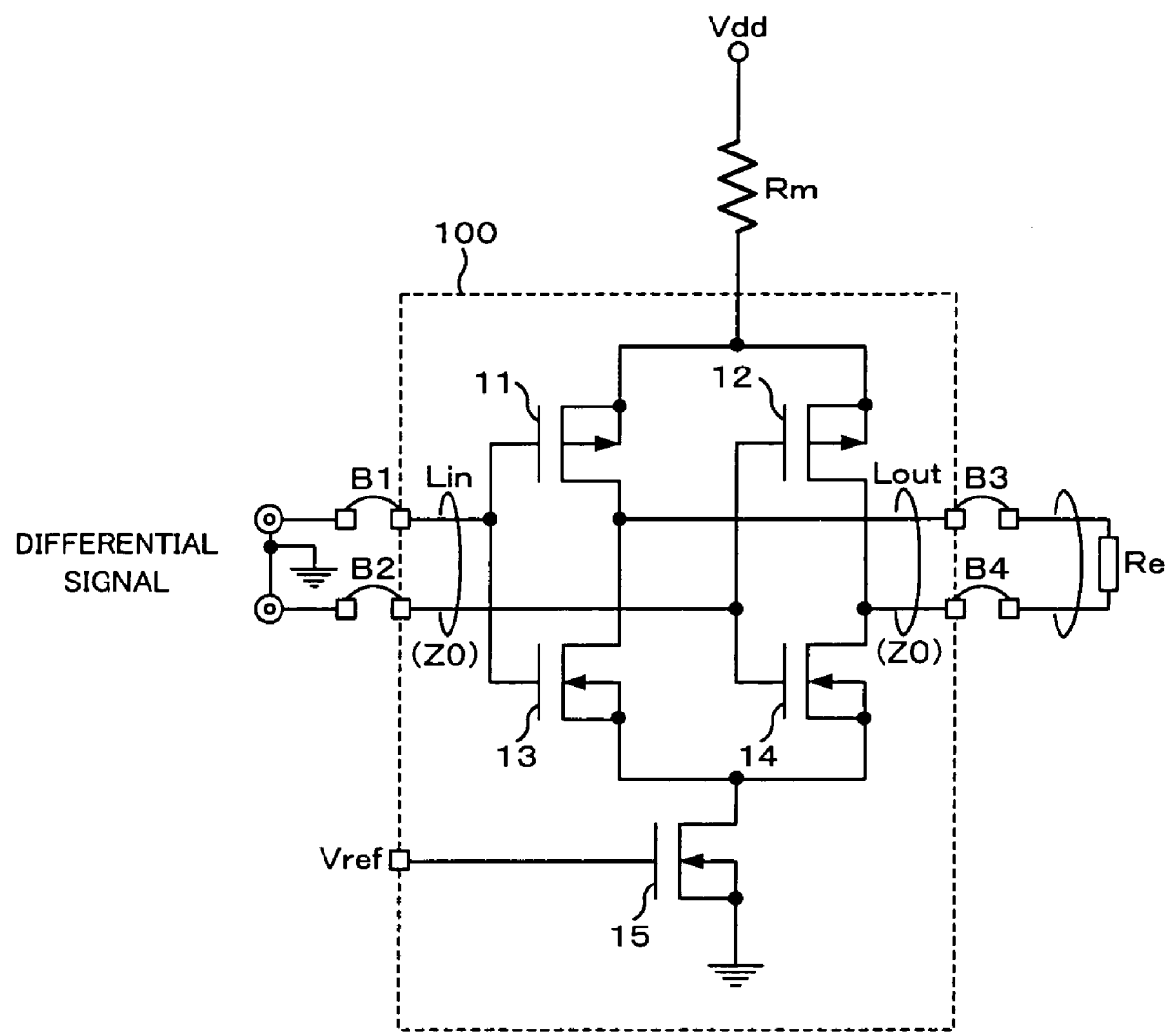
FIG. 11 is a configuration diagram of a measurement system to measure operation characteristics of the differential driver circuit of the embodiment.

Next, experimental results of operation characteristics to verify the effect based on the invention with respect to the differential driver circuit of FIG. 1. FIG. 11 is a configuration diagram of a measurement system to actually measure operation characteristics of the differential driver circuit. In the measurement system of FIG. 11, the differential driver circuit of FIG. 1 is formed on a semiconductor chip 100, and bonding wires B1 to B4 are provided to input and output signals to/from the outside. To measure a current flowing through the differential driver circuit, a series measurement resistor Rm is inserted in the wiring of the power supply Vdd. The input transmission line Lin in the semiconductor chip 100 is matched so that the characteristic impedance Z0 is 100Ω, and deferential signals are input from the outside via the bonding wires B1 and b2. The output transmission line Lout in the semiconductor chip is also matched so that the characteristic impedance Z0=100Ω, an output signal of the line Lout is supplied to a termination resistor Re (for example, Re=100Ω) via the bonding wires B3 and B4, and the voltage between opposite ends is output to the outside.

Figure 12:
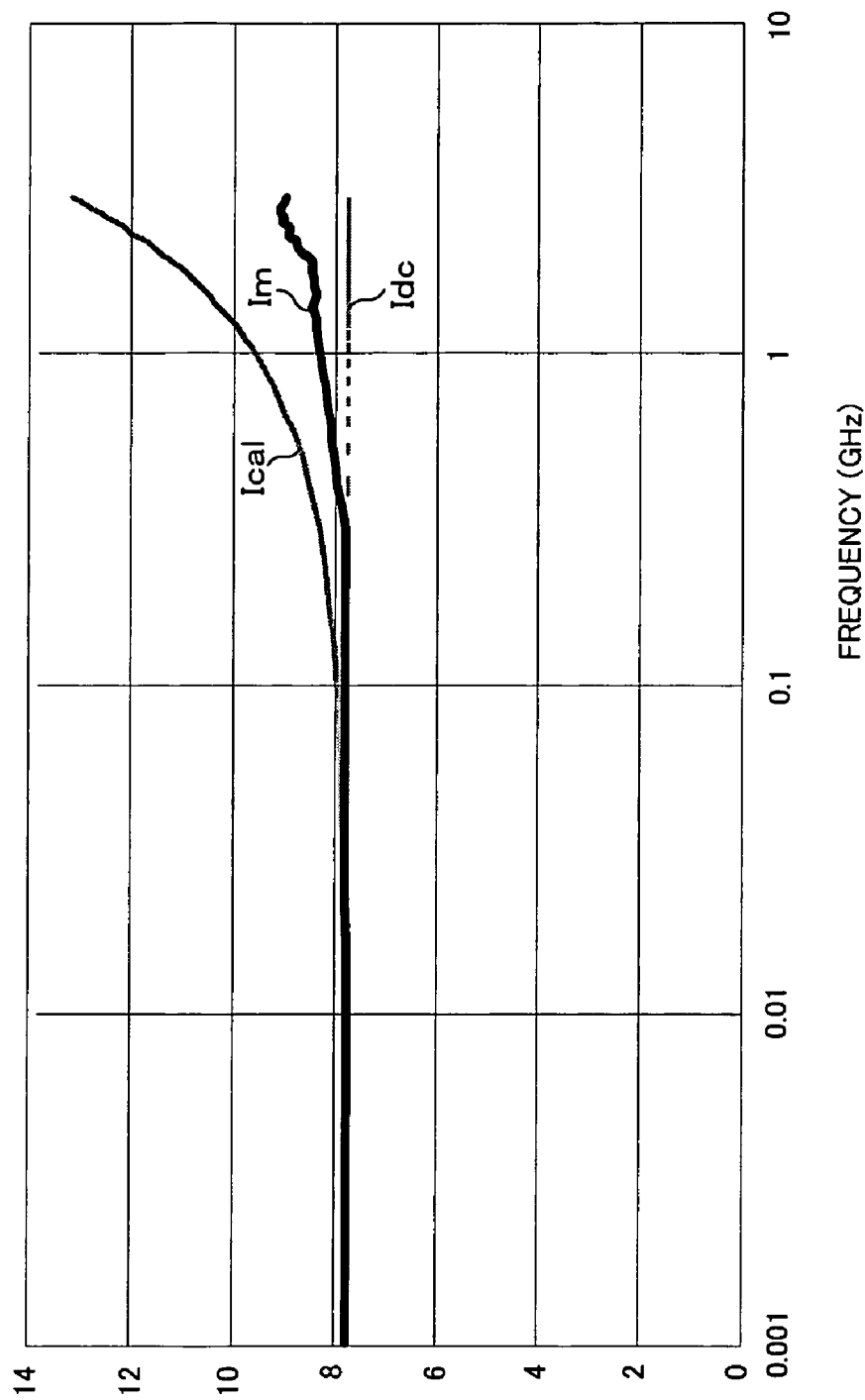
FIG. 12 is a chart showing current characteristics based on the measurement system of FIG. 11.

FIG. 12 illustrates current characteristics based on the measurement system of FIG. 11. FIG. 12 shows a variation in the current measured by the above-mentioned measurement resistor Rm in varying the frequency of the differential signals in a wide range. When Vdd set at 1.8(V) (Vdd=1.8(V)) and the differential signals with a predetermined frequency are input, a measured current value Im, a direct component Idc of the Im, and a calculated current value Ical based on the capacitance characteristics of the MOS transistors are superposed respectively in FIG. 12. In a region with low frequencies, the effect of the capacitances of the MOS transistors do not appear, and the measured current value Im, direct component Idc and calculated current value Ical are similar values and show flat characteristics.

In a region with frequencies of the order of GHz, the calculated current value Ical increases abruptly due to the effect of frequency characteristics (with an impedance component of 1/ωC) of the capacitances of the MOS transistors. In contrast thereto, the measured current value Im tends to increase slightly when the frequency exceeds 800 MHz, but maintains a sufficiently smaller value than that of the calculated current value Ical. This is the characteristic based on the effect that under circumstances where the capacitances of the MOS transistors increase, charges required for inversion are immediately supplied by charge exchange of the pair transistors with the complementary structure.

Figure 13:
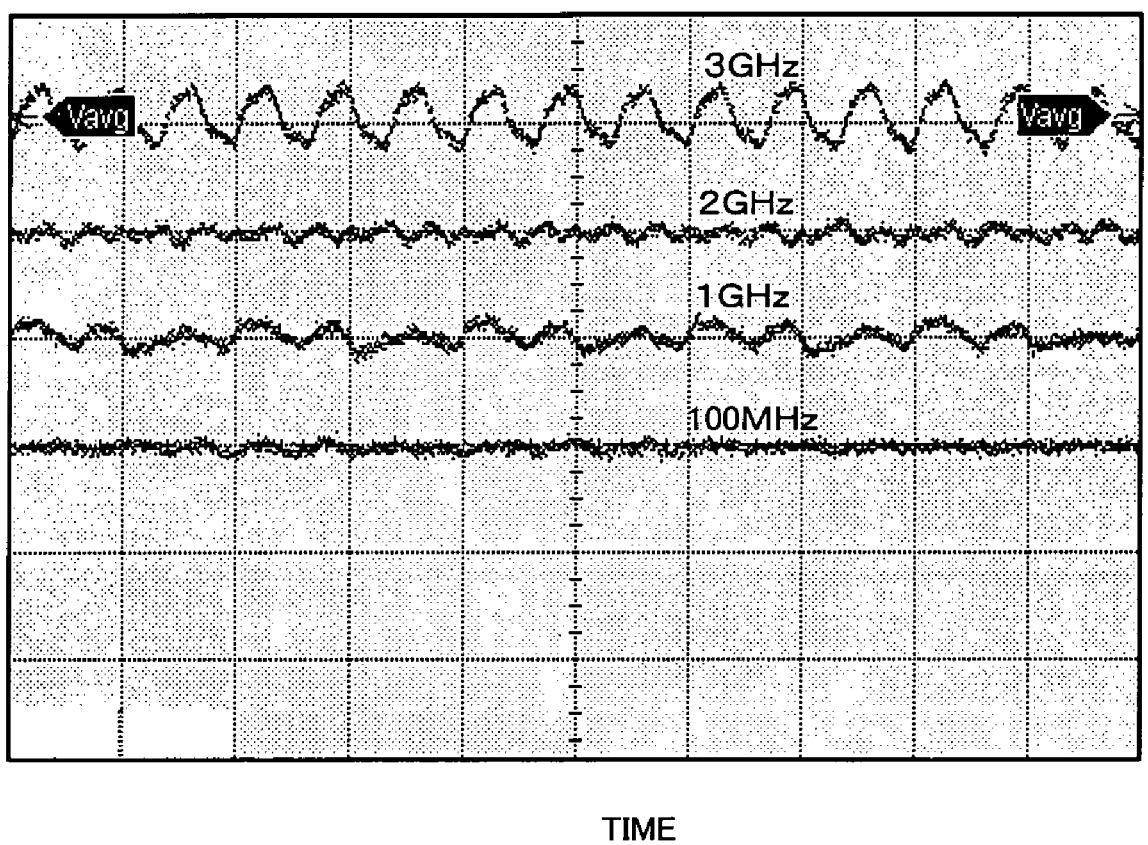
FIG. 13 is a chart showing variations in voltage value corresponding to the frequency of deferential signals in power supply voltage Vdd supplied to the differential driver circuit of the embodiment.

FIG. 13 is a chart showing variations in voltage value of the power supply Vdd supplied to the differential driver circuit of this embodiment. With Vdd set at 2.2(v) (Vdd=2.2(V)), FIG. 13 shows waveforms of the power supply Vdd when the frequency of the differential signals is changed to 100 MHz, 1 GHZ, 2 GHZ, and 3 GHz. Since the current increases in a high-frequency region as described above, it is understood that the variation in voltage value is also large due to the effect of the power supply-ground inductance component. However, the variation component in power supply Vdd in FIG. 13 is the order of several millivolts even in the case of 3 GHz, and is of the level without problems on the operation.

Figure 14:
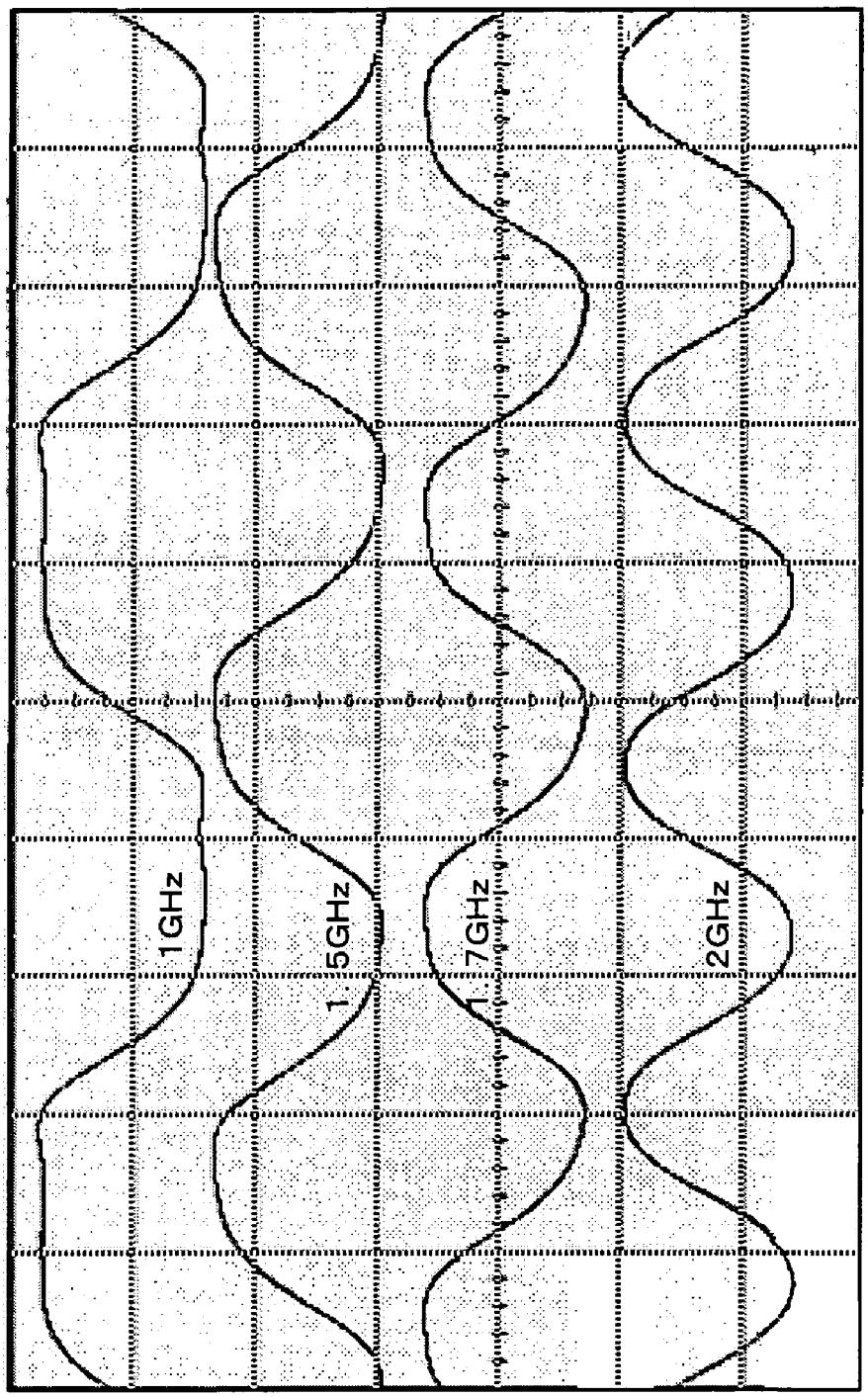
FIG. 14 is a chart showing variations in waveform corresponding to the frequency of deferential signals with respect to the output signal of the differential driver circuit of the embodiment.
Figure 15A:
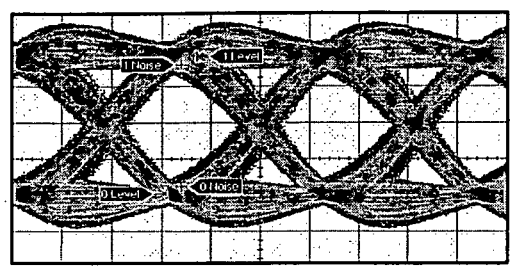
FIGS. 15A to 15E are charts showing eye patterns of input/output characteristics of the differential driver circuit of the embodiment.
Figure 15B:
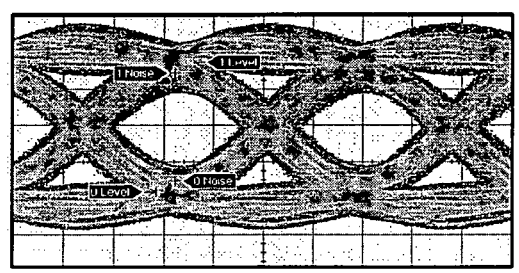
Figure 15C:
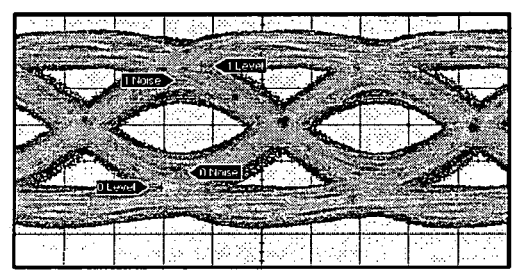
Figure 15D:
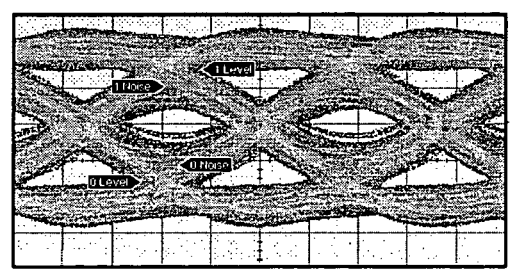
Figure 15E:
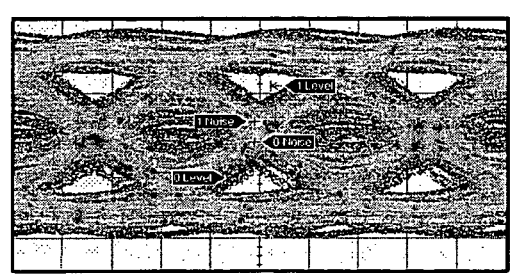

FIG. 14 is a chart showing variations in waveform corresponding to the frequency of the differential signals with respect to the output signal of the differential driver circuit of this embodiment. With Vdd set at 1.8(V) (Vdd=1.8(V)), FIG. 14 shows four types of waveforms respectively for 1 GHz, 1.5 GHz, 1.7 GHz and 2 GHz. The waveform approximates a sine wave in high-frequency region, but sufficient amplitude is guaranteed on every frequency, and it is thus confirmed that the frequencies are within the operation range of the differential driver circuit of this embodiment.

FIG. 15 is a view showing eye patterns of input/output characteristics of the differential driver circuit of this embodiment. To compare waveforms in eye pattern corresponding to the transmission rate of the input signal to the differential driver circuit, FIGS. 15A to 15E show waveforms in eye pattern when the transmission rate is varied by 1 Gbps in a range of 8 Gbps to 12 Gbps. As the transmission rate increases, the size in eye part of the eye pattern decreases. Referring to each eye pattern of FIG. 15, it is understood that the eye part is not identified at 12 Gbps, but of the sufficient size in a range of 8 Gbps to 10 Gbps, and in a state capable of its identification even at 11 Gbps. Thus, the differential driver circuit of this embodiment implements the operation on high-speed transmission signals of maximum 10 Gbps to 11 Gbps.

Figure 16:
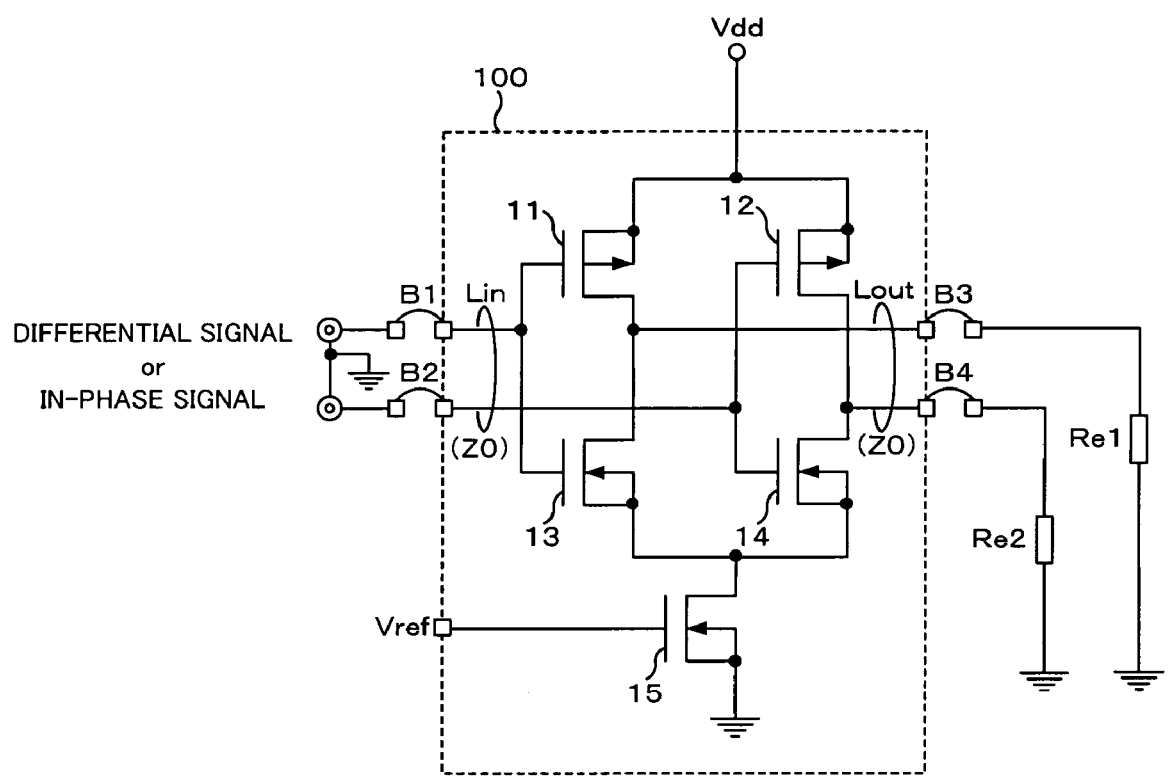
FIG. 16 is a configuration diagram of a measurement system to measure operation characteristics when deferential signals and in-phase signals are input to the differential driver circuit of the embodiment.

Next, comparison in operation characteristics between cases of inputting deferential signals and in-phase signals is described. When in-phase signals are input, since both of the charge exchange effect of the pair transistors and the effect of the transmission line structure are eliminated, the effect of this embodiment is confirmed by a difference in output waveform between inputs of the in-phase signals and differential signals. FIG. 16 shows a configuration diagram of a measurement system to actually measure operation characteristics according to this purpose. In FIG. 16, as compared with the configuration diagram of FIG. 11, although the measurement resistor Rm is not inserted, termination resistors Re1 and Re2 are inserted in pair line on the output side. Assuming that in-phase signals are input and that termination resistors Re1 and Re2 are connected to the ground, in order not to exceed a permissible current, it is required to select a slightly large value (about 330Ω) for each of the termination resistors Re1 and Re2.

Figure 17A:
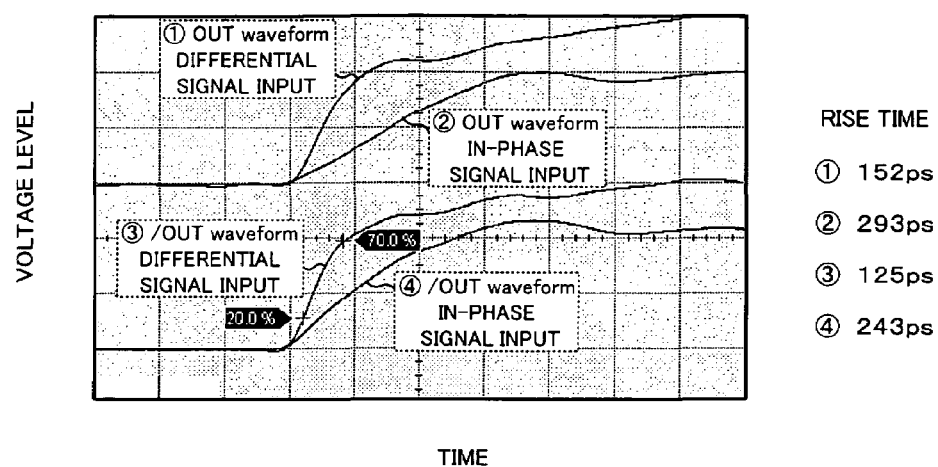
FIGS. 17A and 17B are charts showing output waveforms when the differential signals and in-phase signals are input via input transmission line Lin in the measurement system of FIG. 16.
Figure 17B:
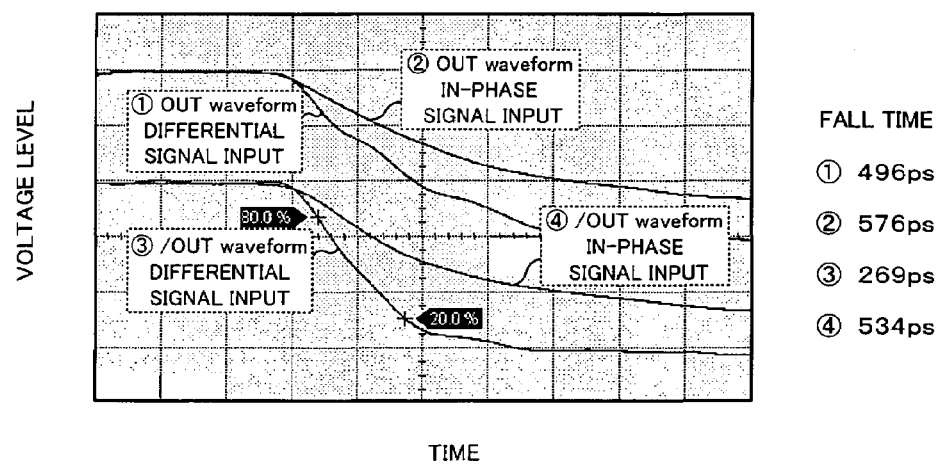

FIGS. 17A and 17B are charts showing output waveforms when the differential signals or in-phase signals are input via the input transmission line Lin in the measurement system of FIG. 16. Herein, inputs of in-phase signals means that the same signals are input to two input terminals in the measurement system as shown in FIG. 16. The measurement system of this case exhibits the operation substantially as an inverter, and output signals OUT and /OUT are in-phase. FIG. 17A shows four rising waveforms on an output signal pair of OUT and /OUT when the differential signals are input and on an output signal pair of OUT and /OUT when the in-phase signals are input. FIG. 17B shows four falling waveforms on the same input conditions. Shown further are rise time corresponding to four rising waveforms of FIG. 17A and fall time corresponding to four falling waveforms of FIG. 17B.

When the differential signals are input, as compared with the in-phase signals, both rising and falling waveforms vary abruptly. In response to the abrupt variation, the rise time and fall time when the differential signals are input are greatly reduced as compared with the case of the in-phase signals. When the differential signals are input, in addition to fast transfer of charges in the pair transistors based on the charge exchange effect, high-speed operation is allowed by taking measures against the RC delay based on the transmission line structure. In contrast thereto, when the in-phase signals are input, since both elements are canceled, high-speed operation is considered become difficult.

Figure 18:
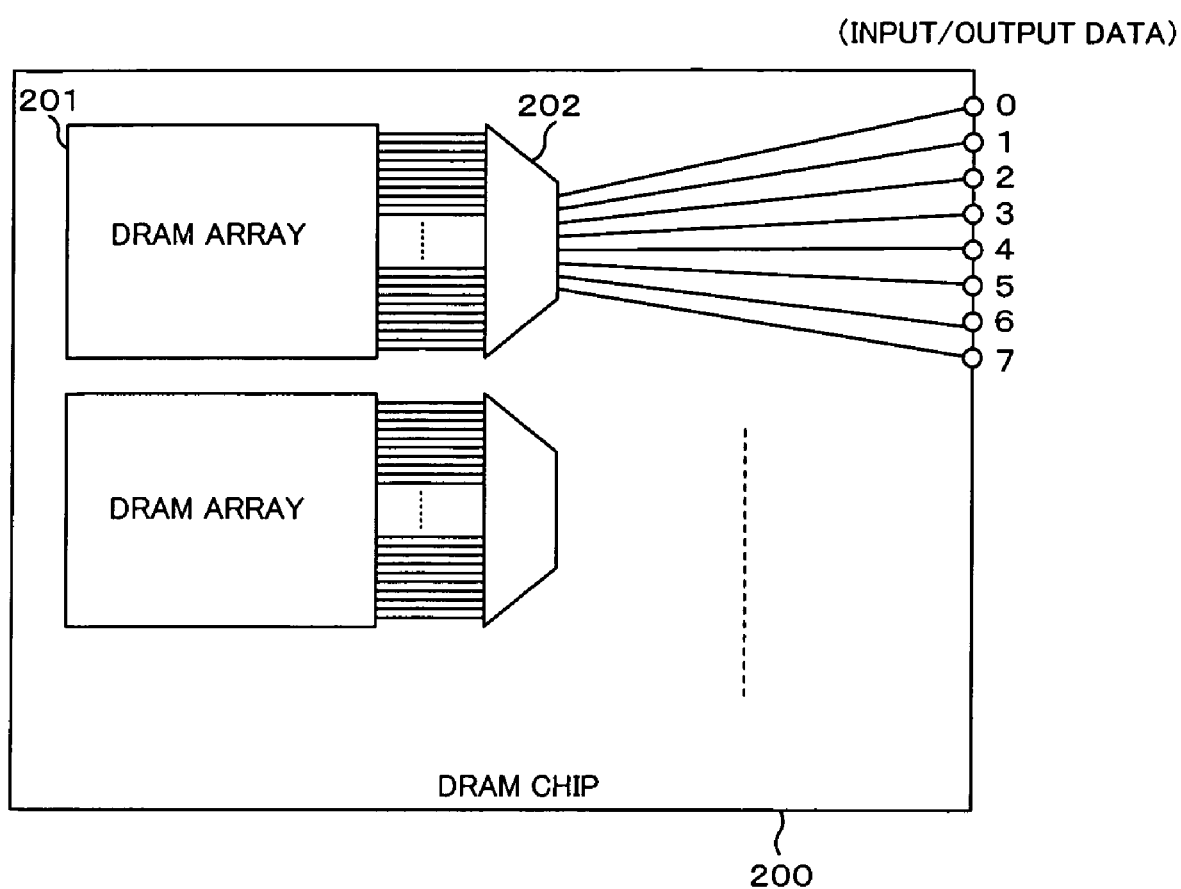
FIG. 18 is a diagram showing a configuration example when the differential driver circuit is used in a data input/output circuit of a DRAM chip as an application example of the differential driver circuit of the embodiment.

Next, application examples of the differential driver circuit of this embodiment are described. FIG. 18 shows a configuration example of the case of using the differential driver circuit of this embodiment in a data input/output circuit of a DRAM chip. A plurality of DRAM arrays 201 with a predetermined storage capacity is provided on the DRAM chip 200, and serial converters 202 which convert parallel signals into serial signals are provided corresponding to respective DRAM arrays 201. The serial converter 202 is required to convert data of a predetermined number of data lines to a serial signal, for example, data of 16 data lines is aggregated into one line to transmit to the outside. Therefore, the transmission frequency increases corresponding to the ratio of converting, it is required to operate at frequencies of the order of GHz, and installation of the differential driver circuit of this embodiment enables high-speed operation.

While the aforementioned embodiment describes the case of applying the invention to the differential driver circuit as a basic configuration example, there are various application examples of the invention in other semiconductor circuits. Described below is a case of applying the invention to termination resistor circuits provided on the input side of a logic circuit such as an inverter circuit, for example.

Figure 19:
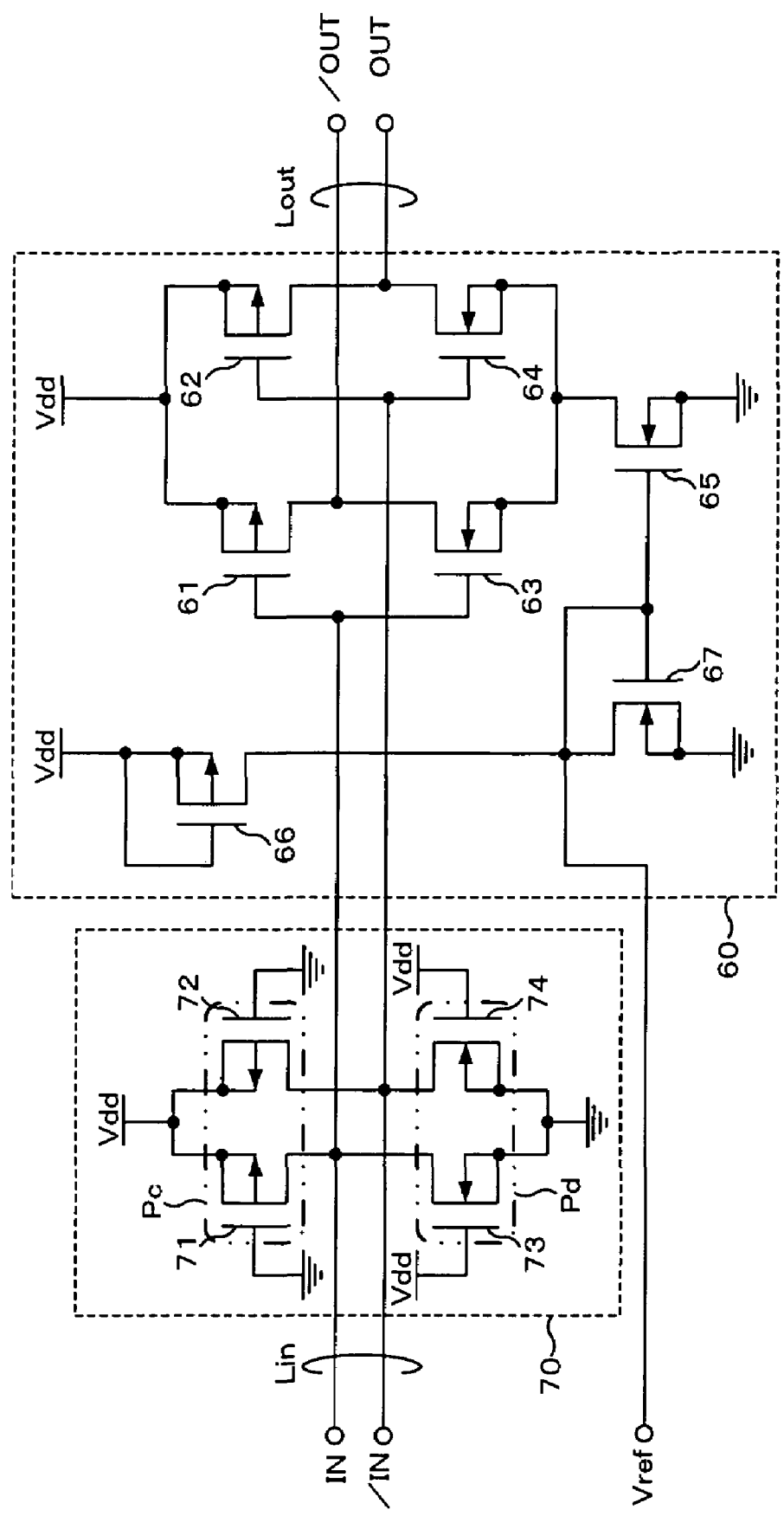
FIG. 19 is a diagram showing a circuit block including a first termination resistor circuit to which the invention is applied.

FIG. 19 is a diagram illustrating a circuit block including a first termination resistor circuit to which the invention is applied. In FIG. 19, a termination resistor circuit 70 is connected to the input side of an inverter circuit 60. For example, the inverter circuit 60 is configured by using the differential driver circuit of FIG. 1, and is comprised of MOS transistors 61 to 65 corresponding to the MOS transistors 11 to 15 of FIG. 1 and MOS transistors 66 and 67 that determine a reference voltage Vref.

The termination resistor circuit 70 is configured by connecting PMOS transistors 71 and 72 and NMOS transistors 73 and 74, and on-resistances thereof operate as a resistor circuit connected between the power supply Vdd and ground. Gates of the PMOS transistors 71 and 72 are connected to the ground, gates of the NMOS transistors 73 and 74 are connected to to the power supply Vdd, and the whole circuit is always maintained at ON state. Then, one input signal IN of the transmission line Lin is connected to each drain of the PMOS transistor 71 and NMOS transistor 73, and the other inverted input signal /IN of the transmission line Lin is connected to each drain of the PMOS transistor 72 and NMOS transistor 74.

In the configuration of FIG. 19, the PMOS transistors 71 and 72 constitute pair transistors Pc with the complementary structure, and drains of the transistors are arranged adjacent to each other in the same well. Similarly, the NMOS transistors 73 and 74 constitute pair transistors Pd with the complementary structure, and drains of the transistors are arranged adjacent to each other in the same well. By thus providing two sets of pair transistors Pc and Pd, as in the case of FIG. 1, when mutually opposite phase fast signals are used, it is possible to achieve high-speed operation based on the charge exchange effect while substantially suppressing the effect of the drain capacitance. In FIG. 19, the basic principle and structure of the pair transistors Pc and Pd are the same as in the pair transistors of FIG. 1 corresponding to the differential driver circuit, and descriptions thereof are omitted.

Figure 20:
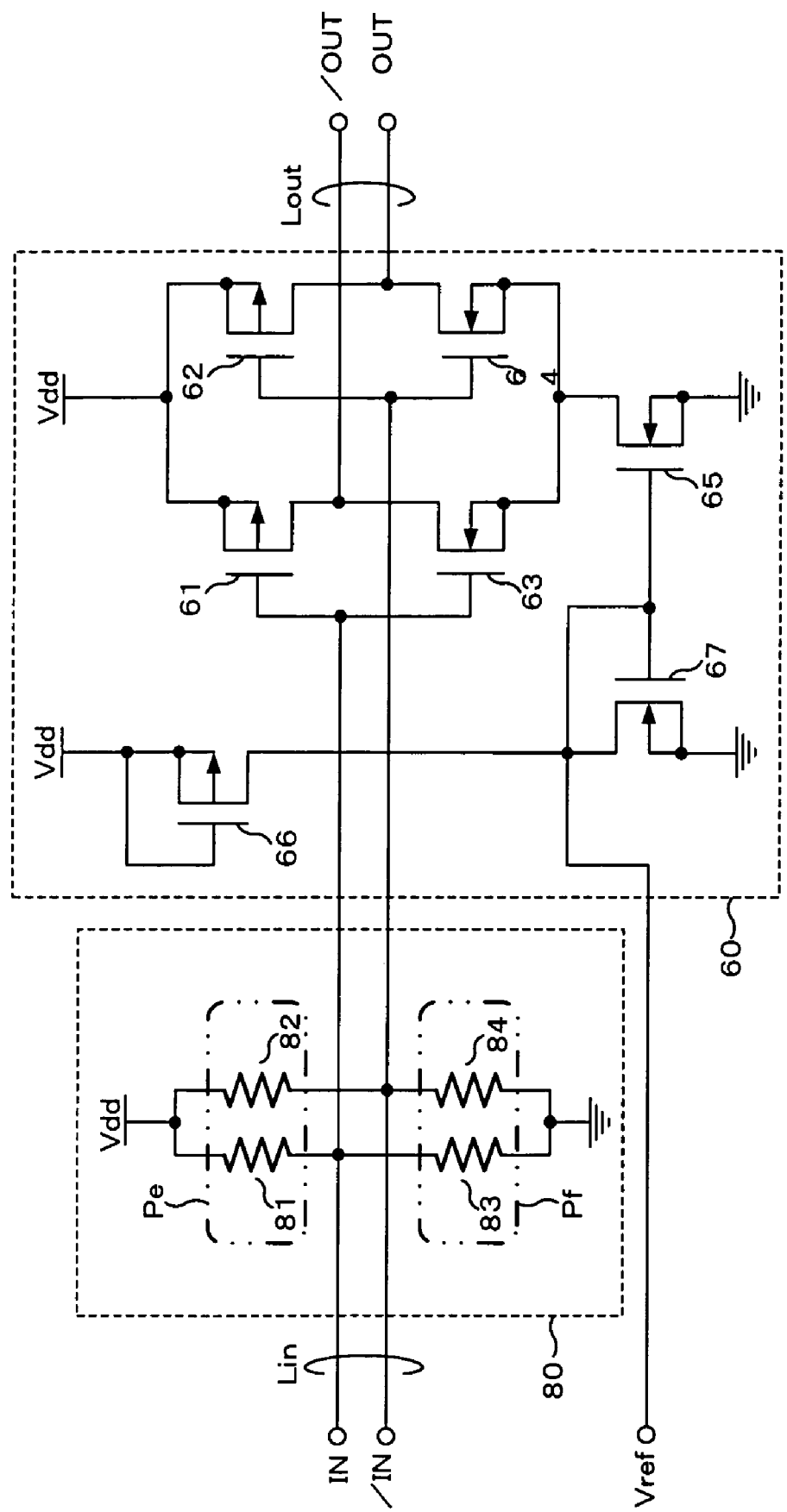
FIG. 20 is a diagram showing a circuit block including a second termination resistor circuit to which the invention is applied.

FIG. 20 is a diagram illustrating a circuit diagram including a second termination resistor circuit to which the invention is applied. In FIG. 20, the configuration in which a termination resistor circuit 80 is connected to the input side of the inverter circuit 60 is the same as that in FIG. 19, but a structure of the termination resistor circuit 80 is different from that in FIG. 19. In other words, the termination resistor circuit 80 is comprised of four diffusion layer resistances 81 to 84 instead of the MOS transistors. One input signal IN of the transmission line Lin is connected between the diffusion layer resistances 81 and 83, and the other inverted input signal /IN is connected between the diffusion layer resistances 82 and 84. Then, one ends of the diffusion layer resistances 81 and 82 are connected to the power supply Vdd, and one ends of the diffusion layer resistances 83 and 84 are connected to the ground.

In the configuration of FIG. 20, the diffusion layer resistances 81 and 82 on the power supply Vdd side constitute pair resistances Pe with the complementary structure, and the diffusion layers are arranged adjacent to each other in the same well. Similarly, the diffusion layer resistances 83 and 84 on the ground side constitute pair resistances Pf with the complementary structure, and the diffusion layers are arranged adjacent to each other in the same well. By thus providing two sets of pair resistances, Pe and Pf, when mutually opposite phase fast signals are used, it is possible to substantially suppress the effect of the diffusion layer capacitance and achieve high-speed operation based on the charge exchange effect as in FIG. 19.

Although the present invention has been explained concretely based on the embodiments, the invention should not be limited to the embodiment, and various modifications can be made within a range not departing from a subject matter of the invention. For example, although the case is described in this embodiment that the present invention is applied to mainly the differential driver circuit and the termination resistor circuit, the invention is widely applied to various other logic circuits in the semiconductor integrated circuit having a structure in which diffusion layers are arranged adjacent to each other.

The present invention is not limited to the above described embodiments, and various variations and modifications may be possible without departing from the scope of the present invention.

This application is based on the Japanese Patent application No. 2004-338237 filed on Nov. 22, 2004, entire content of which is expressly incorporated by reference herein.

What is claimed is:

1. A semiconductor integrated circuit comprising:
   a pair of MOS transistors which are formed in a same well on a semiconductor substrate and arranged adjacent to each other at a distance such that charge exchange between capacitances of respective drain diffusion layers is possible; and
   a wiring structure which is formed to apply differential signals to respective gates of said pair of MOS transistors and to apply a common potential to respective source diffusion layers of said pair of MOS transistors;
   wherein a part of the well is disposed between said respective drain diffusion layers of said pair of MOS transistors, and none of said respective source diffusion layers of said pair of MOS transistors is disposed between said respective drain diffusion layers.

2. A semiconductor integrated circuit according to claim 1, wherein said pair of MOS transistors are arranged adjacent to each other with a distance such that a transit time of charges by said charge exchange between said drain diffusion layers is smaller than a transition time during phase inversion of said differential signals.

3. A semiconductor integrated circuit according to claim 1, wherein said pair of MOS transistors are arranged adjacent to each other so that sides of said drain diffusion layers along a gate width direction are opposed to each other.

4. A semiconductor integrated circuit according to claim 3, wherein a plurality of pairs of MOS transistors is arranged in the same well, and gates, drains and sources therof are mutually connected respectively.

5. A semiconductor integrated circuit according to claim 1, wherein said wiring structure is formed by connecting a paired structure of transmission line composed of two lines which transmit differential signals.

6. A semiconductor integrated circuit according to claim 5, wherein characteristic impedance of said paired structure of transmission line is determined in a range of 50 to 200Ω.

7. A semiconductor integrated circuit according to claim 5 or 6, wherein a relationship $$2a \leq b$$

is satisfied where a is a distance between one line and the other line of said paired structure of transmission line, and b is a distance between said paired structure of transmission line and another paired structure of transmission line adjacent to said paired structure of transmission line.

8. A semiconductor integrated circuit comprising:
   a pair of MOS transistors which are formed in a same well on a semiconductor substrate and arranged adjacent to each other at a distance such that charge exchange between capacitances of respective drain diffusion layers is possible; and
   a wiring structure which is formed to apply differential signals to respective gates of said pair of MOS transistors and to apply a common potential to respective sources of said pair of MOS transistors; and
   a differential circuit comprised of said pair of MOS transistors,
   wherein in said wiring structure, differential input signals include a positive signal and an inverted signal, said positive signal is applied to one gate of said pair of MOS transistors, said inverted signal is applied to the other gate of said pair of MOS transistors, and differential output signals are output from said drain diffusion layer of each of said pair of MOS transistors;
   and in addition to said pair of MOS transistors, one or more other MOS transistors are formed in the same well and are arranged with a distance such that interference due to said charge exchange between said drain diffusion layers of said pair of MOS transistors and drain diffusion layers of said other MOS transistors does not occur.

9. A semiconductor integrated circuit according to claim 8, wherein said pair of MOS transistors are arranged to satisfy a relationship $$1.5 \times d \leq k$$

where d is a distance between said drain diffusion layers of said pair of MOS transistors, and k is a minimum distance between said drain diffusion layers of said pair of MOS transistors and drain diffusion layers of said other MOS transistors.

10. A semiconductor integrated circuit comprising:
   a pair of MOS transistors which are formed in a same well on a semiconductor substrate and arranged adjacent to each other with a distance such that charge exchange between capacitances of respective drain diffusion layers is possible; and
   a wiring structure which is formed so that a termination resistor circuit is configured using on-resistances of respective said pair of MOS transistors on a first line and a second line which transmit differential signals, and said first line is connected to one of said drain diffusion layers of said pair of MOS transistors, while said second line is connected to the other one of said drain diffusion layers of said pair of MOS transistors.

11. A semiconductor integrated circuit comprising:

a pair of diffusion layer resistances which are formed in a same well on a semiconductor substrate and arranged adjacent to each other with a distance such that charge exchange therebetween is possible; and a wiring structure which is formed so that a termination resistor circuit is configured using said pair of diffusion layer resistances on a first line and a second line which transmit differential signals, and said first line is connected to one of said diffusion layer resistances, while said second line is connected to the other one of said diffusion layer resistances.

* * * * *